United States Patent
Yoshimoto et al.

(10) Patent No.: US 9,948,288 B2
(45) Date of Patent: Apr. 17, 2018

(54) COMPENSATION CIRCUIT AND COMPENSATION METHOD

(71) Applicant: Panasonic Corporation, Osaka (JP)

(72) Inventors: Atsushi Yoshimoto, Hyogo (JP); Hiroshi Komori, Shiga (JP); Ryo Kitamura, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 118 days.

(21) Appl. No.: 14/403,963

(22) PCT Filed: Mar. 14, 2014

(86) PCT No.: PCT/JP2014/001476
§ 371 (c)(1),
(2) Date: Nov. 25, 2014

(87) PCT Pub. No.: WO2014/156036
PCT Pub. Date: Oct. 2, 2014

(65) Prior Publication Data
US 2015/0171854 A1   Jun. 18, 2015

(30) Foreign Application Priority Data
Mar. 27, 2013 (JP) .................................. 2013-067417

(51) Int. Cl.
*G05F 1/10* (2006.01)
*H03K 17/14* (2006.01)
(Continued)

(52) U.S. Cl.
CPC ............. *H03K 17/14* (2013.01); *H03F 1/301* (2013.01); *H03F 3/45475* (2013.01);
(Continued)

(58) Field of Classification Search
CPC ....... H01L 2924/00; H01L 2924/00014; H01L 2224/48247; H01L 2224/49175
See application file for complete search history.

(56) References Cited

U.S. PATENT DOCUMENTS 5,422,598 A   6/1995   Maeda et al.
7,518,452 B2  4/2009   Imai
(Continued)

FOREIGN PATENT DOCUMENTS

JP   6-252662 A    9/1994
JP   2004-187150 A 7/2004
(Continued)

OTHER PUBLICATIONS

International Search Report, dated Jun. 17, 2014, for International Application No. PCT/JP2014/001476, 4 pages.
(Continued)

*Primary Examiner* — Sibin Chen
(74) *Attorney, Agent, or Firm* — Seed IP Law Group LLP

(57) ABSTRACT

Provided is a compensation circuit capable of improving compensation precision for manufacturing variations. The compensation circuit includes a manufacturing variation detection circuit which detects manufacturing variation of a transistor based on a first voltage output from an output terminal of the transistor having an input terminal applied with a substantially constant first current to temperature or based on a second current output from an output terminal of the transistor having an input terminal applied with a substantially constant second voltage to temperature, and a voltage generation circuit which generates a supply voltage supplied to an electric circuit based on the manufacturing variation. The first current corresponds to the substantially
(Continued)

constant second voltage to temperature, and the first voltage corresponds to the substantially constant second current to temperature.

16 Claims, 35 Drawing Sheets

(51) Int. Cl.
  *H03F 1/30* (2006.01)
  *H03F 3/45* (2006.01)
  *H03K 17/56* (2006.01)
(52) U.S. Cl.
  CPC ... *H03K 17/56* (2013.01); *H03F 2203/45528* (2013.01); *H03F 2203/45568* (2013.01); *H03F 2203/45571* (2013.01); *H03F 2203/45594* (2013.01)

(56) References Cited

U.S. PATENT DOCUMENTS

2003/0117120 A1* 6/2003 Amazeen ............... G05F 3/30
   323/313
2004/0108889 A1* 6/2004 Kizaki .................. G05F 3/30
   327/541
2007/0205841 A1 9/2007 Imai
2007/0273448 A1* 11/2007 Vaiana ................ H03F 1/0261
   330/296
2007/0285999 A1* 12/2007 Di Vincenzo .......... G11C 16/26
   365/189.09
2012/0319793 A1 12/2012 Iwasa

FOREIGN PATENT DOCUMENTS

| JP | 2005-94427 A | 4/2005 |
| JP | 2006-330837 A | 12/2006 |
| JP | 2007-228399 A | 9/2007 |
| JP | 2012-198628 A | 10/2012 |
| JP | 2013-5109 A | 1/2013 |

OTHER PUBLICATIONS

Notice of Reasons for Refusal dated Dec. 1, 2015, for corresponding JP Application No. 2013-067417, 8 pages.

* cited by examiner

FIG. 4
(B)
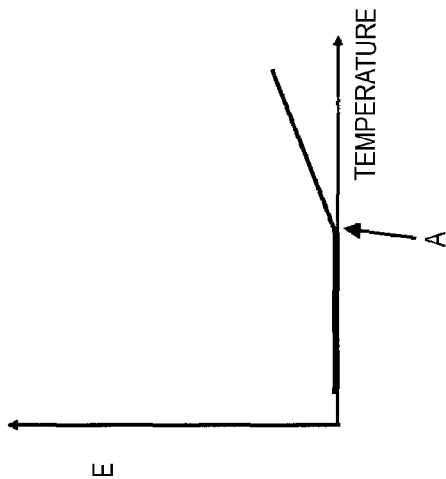
(A)
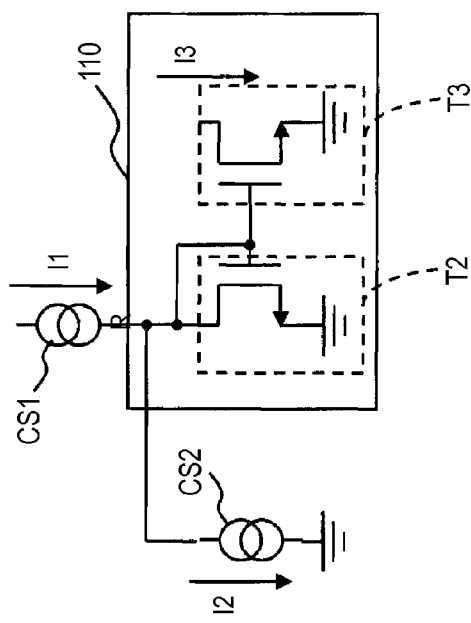

FIG. 13
(A)
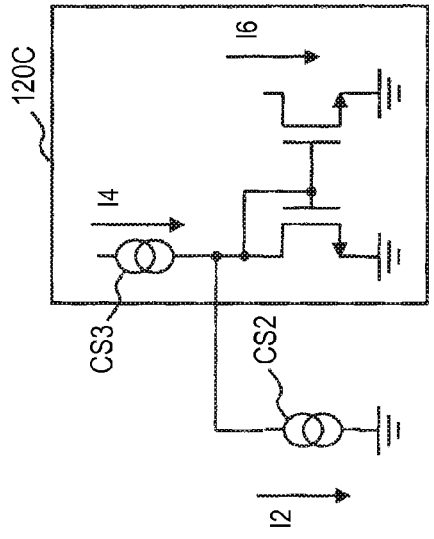
(B)
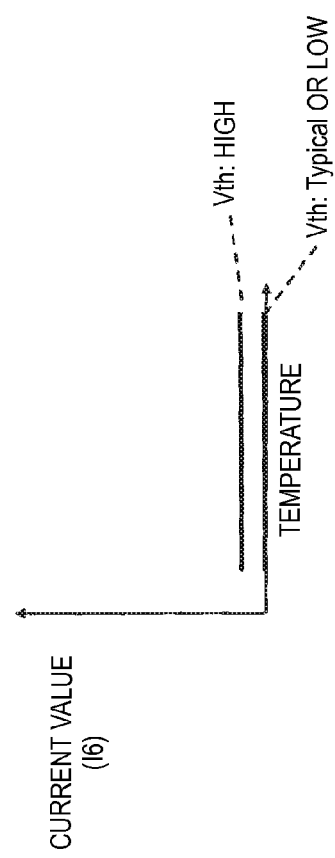

FIG. 14
(A)
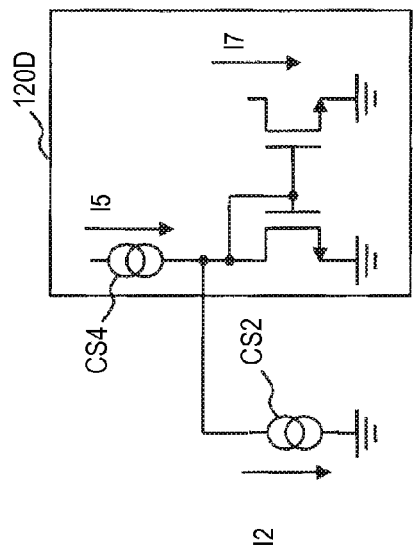
(B)
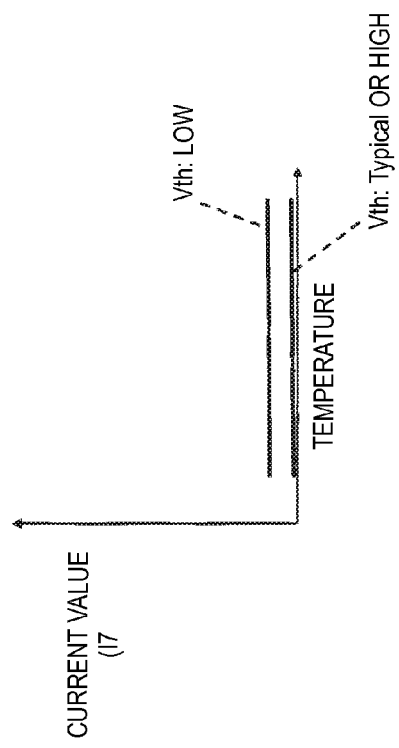

FIG. 34
(B)
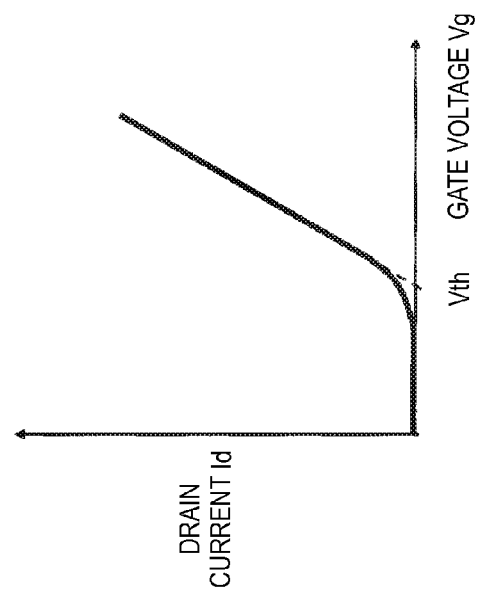
(A)
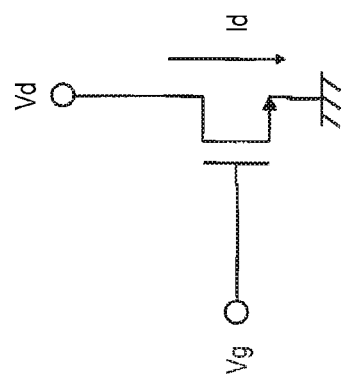

COMPENSATION CIRCUIT AND COMPENSATION METHOD

TECHNICAL FIELD

The present disclosure relates to a compensation circuit and a compensation method.

BACKGROUND ART

A wireless communication device includes an amplifier, and has a function of reducing deterioration in power gain due to the temperature characteristic of the amplifier.

As an amplifier of the related art, a power amplifier including first amplification means for amplifying an input signal, second amplification means for amplifying an output signal of the first amplification means, and control means for controlling a power supply voltage of the second amplification means is known. The control means performs control such that the power supply voltage of the second amplification means increases depending on temperature according to a power supply current which increases depending on the temperature of the first amplification means (for example, see Patent Literature 1).

CITATION LIST

Patent Literature

Patent Literature 1: JP-A-6-252662

SUMMARY OF INVENTION

Technical Problem

The amplifier of Patent Literature 1 has insufficient compensation precision for manufacturing variations (process variations) at the time of manufacturing an IC (Integrated Circuit) chip.

The present disclosure has been accomplished in consideration of the above-described situation, and provides a compensation circuit and a compensation method capable of improving compensation precision for manufacturing variations.

Solution to Problem

A compensation circuit according to the present disclosure is configured to include: a manufacturing variation detection circuit which detects a manufacturing variation of a transistor based on a first voltage output from an output terminal of the transistor having an input terminal applied with a substantially constant first current to temperature or based on a second current output from an output terminal of the transistor having an input terminal applied with a substantially constant second voltage to temperature; and a voltage generation circuit which generates a supply voltage supplied to an electric circuit based on the manufacturing variation detected by the manufacturing variation detection circuit, wherein the first current corresponds to the substantially constant second voltage to temperature, and the first voltage corresponds to the substantially constant second current to temperature.

Advantageous Effects of Invention

According to the present disclosure, it is possible to improve compensation precision for manufacturing variations.

BRIEF DESCRIPTION OF DRAWINGS

In FIG. 4, (A) is a circuit diagram showing a configuration example of a temperature detection circuit in the first embodiment, and (B) is a schematic view showing an example of the characteristic of a current I3 to temperature in the first embodiment.

In FIG. 13, (A) is a circuit diagram showing a third configuration example of a manufacturing variation detection circuit in the first embodiment, and (B) is a schematic view showing an example of the characteristic of a current I6 to temperature for each threshold voltage of a transistor in the first embodiment.

In FIG. 14, (A) is a circuit diagram showing a fourth configuration example of a manufacturing variation detection circuit in the first embodiment, and (B) is a schematic view showing an example of the characteristic of a current I7 to temperature for each threshold voltage of a transistor in the first embodiment.

In FIG. 34, (A) is an equivalent circuit diagram of a transistor, and (B) is a schematic view showing the characteristic of a drain current to a gate voltage of a transistor.

DESCRIPTION OF EMBODIMENTS

Figure 1:
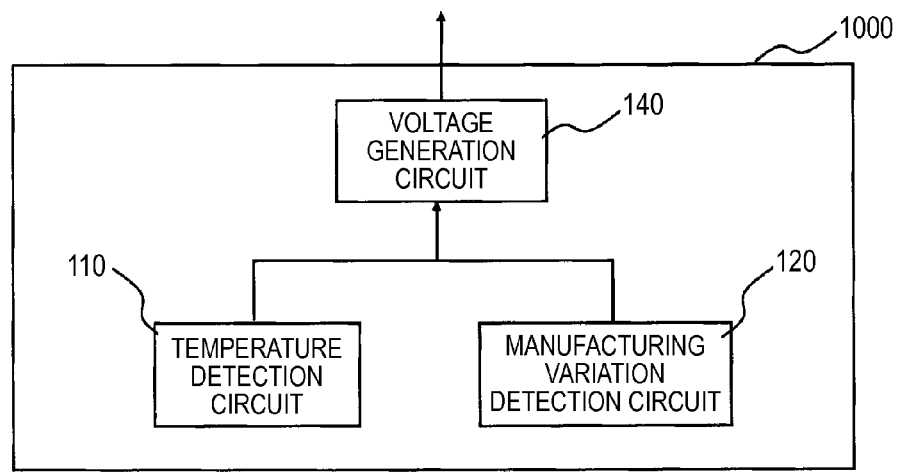
FIG. 1 is a block diagram showing a configuration example of a compensation circuit in a first embodiment.

Hereinafter, an embodiment of the present disclosure will be described referring to the drawings.

(Background of an Aspect of the Present Disclosure)

Reduction of deterioration in power gain due to the temperature characteristic of the related art will be described.

Figure 32:
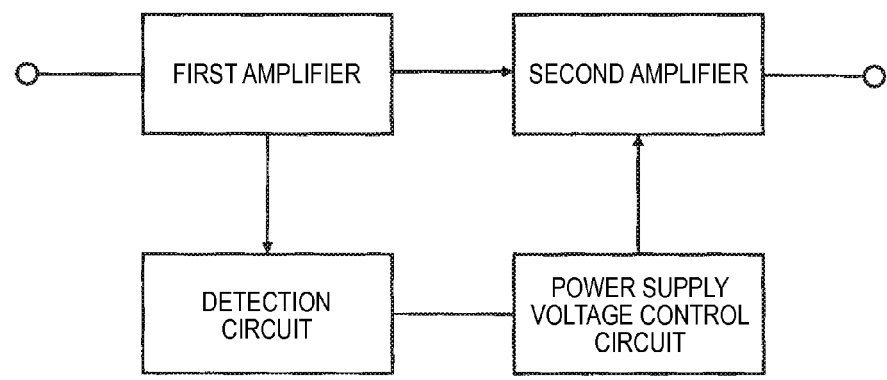
FIG. 32 is a block diagram showing the configuration of a voltage amplification device of Patent Literature 1.
Figure 33:
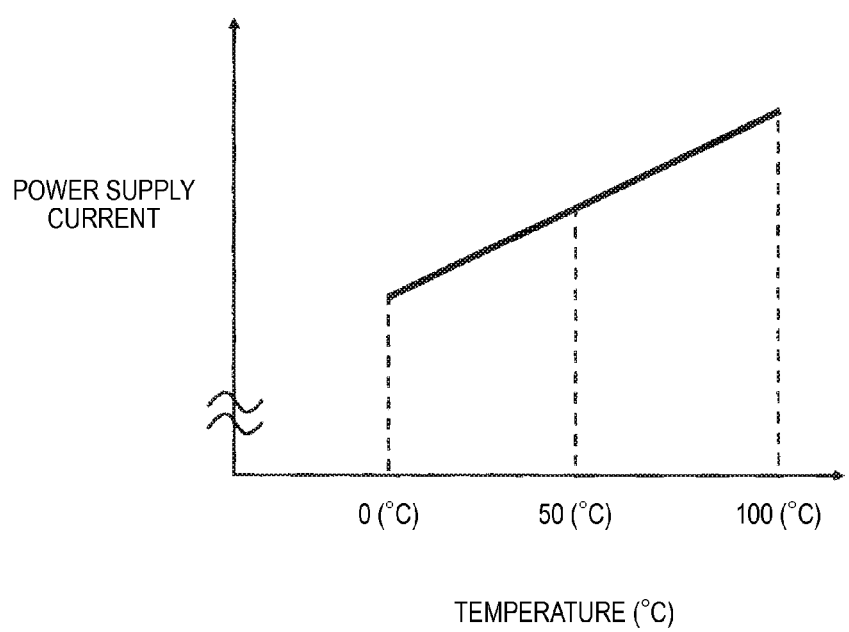
FIG. 33 is a schematic view showing the characteristic of a current generated depending on the temperature of the voltage amplification device of Patent Literature 1.

FIG. 32 is a block diagram showing the configuration of a power amplification device of Patent Literature 1. A first amplifier and a second amplifier of FIG. 32 have the temperature characteristic of a power supply current shown in FIG. 33. According to this characteristic, when the temperature is high, the power supply current increases, and when temperature is low, the power supply current decreases. The power supply voltage control circuit changes the power supply voltage of the second amplifier according to a current flowing in the first amplifier. For example, when the power supply current of the first amplifier increases due to high temperature, the power supply voltage of the second amplifier increases. The power supply voltage control circuit variably controls the power supply voltage, thereby reducing deterioration in power gain due to high temperature of the second amplifier.

In the power amplification device of Patent Literature 1, when the characteristic varies due to manufacturing variations at the time of manufacturing an IC chip, a desired power gain may not be obtained. The manufacturing variations include, for example, variation in the threshold voltage of a transistor.

FIG. 34(A) is a diagram showing the circuit configuration of a MOS (Metal-Oxide-Semiconductor) transistor. FIG. 34(B) is a diagram showing the characteristic of a drain current to a gate voltage of the MOS transistor. As shown in FIG. 34(B), in the MOS transistor, for example, when a gate voltage Vg exceeds a threshold voltage Vth, a drain current Id flows.

In the transistor, the threshold voltage Vth fluctuates according to the manufacturing variations. Specifically, when the threshold voltage Vth is low, the drain current Id increases, and when the threshold voltage Vth is high, the drain current Id decreases.

A maximum operation frequency fmax of the transistor increases when the threshold voltage Vth is low, and decreases when the threshold voltage Vth is high. When the maximum operation frequency fmax is high, the high frequency characteristic of the transistor is improved.

Figure 35:
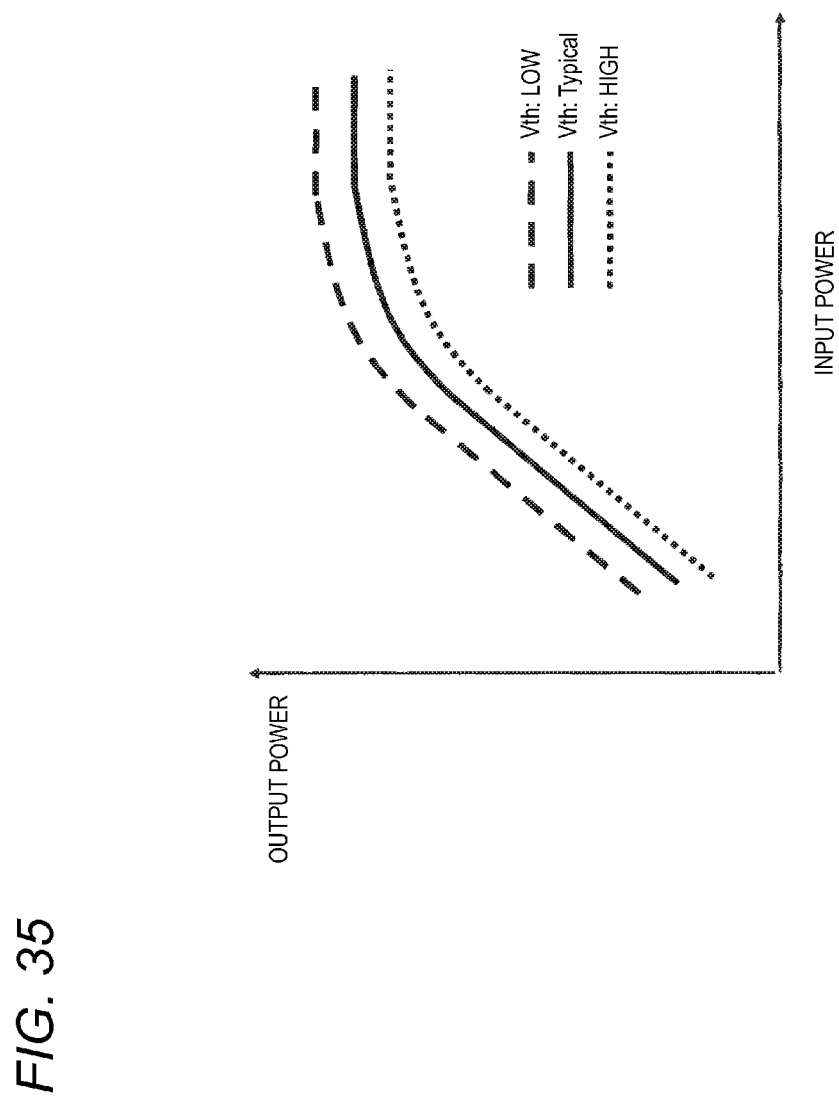
FIG. 35 is a schematic view showing input/output characteristics in respective manufacturing variations of a power amplifier of the related art.

FIG. 35 is a graph showing input/output characteristics in respective manufacturing variations of a transistor of the power amplification device of the related art. FIG. 35 shows when the threshold voltage Vth of the transistor is lower than a predetermined voltage, when the threshold voltage Vth is higher than the predetermined voltage, and when the threshold voltage Vth is the predetermined voltage (Typical).

When the threshold voltage Vth is Typical, this refers to between when the threshold voltage Vth is low and when the threshold voltage Vth is high, and refers to when the transistor can be operated as desired. The threshold voltage Vth which is Typical is, for example, 0.45 V. The threshold voltage Vth of the transistor being lower than the predetermined voltage is simply referred to as the threshold voltage Vth being low. The threshold voltage Vth of the transistor being higher than the predetermined voltage is simply referred to as the threshold voltage Vth being high.

In the manufacturing variation of the power amplification device of the related art, the output power of the power amplification device largely changes. For this reason, when the threshold voltages Vth of the first amplifier and the second amplifier are both high, the power supply current flowing in the first amplifier decreases compared to when the threshold voltages Vth are both Typical.

The power supply voltage control circuit changes the power supply voltage of the second amplifier according to the power supply current flowing in the first amplifier. Accordingly, when the threshold voltages Vth of the first amplifier and the second amplifier are both high, the power supply voltage of the second amplifier is low compared to when the threshold voltage Vth is Typical. In this case, since output power when the threshold value Vth is high is largely lowered compared to output power when the threshold value Vth is Typical, desired power may not be obtained.

Hereinafter, a compensation circuit and a compensation method capable of improving compensation precision for manufacturing variations will be described.

A compensation circuit of an embodiment described below is mounted in, for example, a wireless communication device. The wireless communication device includes, for example, a transmitter or a receiver. The wireless communication device communicates a signal in a high frequency region including, for example, a millimeter-wave band or a micro-wave band.

(First Embodiment)

FIG. 1 is a block diagram showing a configuration example of a compensation circuit 1000 in a first embodiment. The compensation circuit 1000 includes a temperature detection circuit 110, a manufacturing variation detection circuit 120, and a voltage generation circuit 140.

The temperature detection circuit 110 is a circuit which compensates for the temperature characteristic of a transistor included in an electric circuit (not shown) subsequent to the compensation circuit 1000 using a current changing depending on temperature. The electric circuit includes, for example, an amplifier and a frequency divider. The temperature detection circuit 110 is an example of a temperature-current characteristic generation circuit which generates a temperature-current characteristic.

The manufacturing variation detection circuit 120 includes a transistor, and detects manufacturing variation according to an output to a predetermined input to the transistor.

For example, the manufacturing variation detection circuit 120 applies a substantially constant current to temperature to the input terminal of the transistor and detects manufacturing variation based on a voltage (output voltage) output from the transistor. The applied current corresponds to a substantially constant output voltage to temperature.

For example, the manufacturing variation detection circuit 120 applies a substantially constant voltage to temperature to the input terminal of the transistor and detects manufacturing variation based on a current output from the output terminal of the transistor. The applied voltage corresponds to a substantially constant output current to temperature.

The voltage generation circuit 140 generates a supply voltage supplied to the electric circuit subsequent to the compensation circuit 1000 according to at least one of the detection result of the temperature detection circuit 110 and the detection result of the manufacturing variation detection circuit 120. With this, it is possible to generate a voltage according to at least one of the temperature characteristic and manufacturing variation of the transistor.

For example, the temperature detection circuit 110 performs determination of whether or not to increase a current from an arbitrary temperature toward high temperature and reflects the determination result in the output current of the temperature detection circuit 110. The manufacturing variation detection circuit 120 detects the magnitude of the threshold voltage Vth and reflects the detection result in the output current of the manufacturing variation detection circuit 120. The voltage generation circuit 140 receives the current from the temperature detection circuit 110 and the current from the manufacturing variation detection circuit 120, and generates the output voltage of the voltage generation circuit 140.

With this, even when the threshold voltage Vth is high or low, the same characteristic as when the threshold voltage Vth is Typical is obtained by varying a voltage. The influence of the temperature characteristic of the transistor is reduced, and the same characteristic as when the threshold. voltage Vth is Typical is obtained.

Next, the details of the temperature detection circuit 110 will be described.

FIG. 2(A) is a circuit diagram showing an example of a current source CS1 (first current source) using a bandgap circuit. A current I1 which is generated by the current source CS1 is derived by Expression (1).

$$I1 = Vt/R \times \ln(N) \qquad \text{Expression (1)}$$

The respective parameters of Expression (1) are as follows.

$$Vt = ((K \times T)/q)$$

K: Boltzmann constant=1.38e−23 [J/K]
q: charge of electron=1.602e−19[c]
T: absolute temperature [K]. Note that 0 (zero) K=−273.15 [° C.]
N: number of diodes The current I1 derived Expression (1) has the temperature characteristic of Vt, and when temperature increases, the current increases. The current I1 is a current (an example of a fourth current) proportional to temperature. FIG. 2(B) is a schematic view showing an example of the characteristic of the current I1 to temperature.

FIG. 3(A) is a circuit diagram showing a configuration example of a current source CS2 (second current source) which generates a current I2 using the current source CS1. The current I2 has the temperature characteristic (temperature coefficient of resistance) of a resistor R3. The resistance value has low dependence on temperature and is substantially constant. Accordingly, the current I2 is a substantially constant current (an example of a first current) to temperature. FIG. 3(B) is a schematic view showing an example of the characteristic of the current I2 to temperature.

The current source CS2 has a configuration in which a resistor R2 is further provided in the current source CS1 including the bandgap circuit of FIG. 2(A), and generates a bandgap reference voltage Vref The bandgap reference voltage Vref does not depend on the manufacturing variation and the temperature characteristic of the bandgap circuit, is a substantially constant voltage, and is, for example, a bandgap voltage (about 1.2 V to 1.25 V) of silicon.

The bandgap reference voltage Vref is input to one input terminal of an operational amplifier OA1. The other input terminal of the operational amplifier OA1 is connected to the resistor R3. Accordingly, the current I2 represented by Expression (2) is derived as a current flowing in the resistor R3.

$$I2 = Vref/R3 \qquad \text{Expression (2)}$$

FIG. 4(A) is a circuit diagram showing a configuration example of the temperature detection circuit 110. The temperature detection circuit 110 is a circuit which subtracts the current I2 from the current I1 and derives a current I3 represented by Expression (3). The current I3 is an example of a fifth current.

$$I3 = I1 - I2 \qquad \text{Expression (3)}$$

The characteristics (for example, transistor size) of transistors T2 and T3 may be identical or different. In the temperature detection circuit 110, for example, when the gain of the transistor T2 is "1" and the gain of the transistor T3 is "N", it is possible to determine the degree of increase of the current I3 toward high temperature by the value of "N".

In FIG. 4(A), although a configuration in which the temperature detection circuit 110 does not include the current source CS1 and the current source CS2 has been illustrated, the temperature detection circuit 110 may include at least one of the current sources CS1 and CS2. A circuit part relating to the subtraction of Expression (3) may be realized by a configuration different from FIG. 4(A) when the same characteristic is obtained.

FIG. 4(B) is a schematic view showing an example of the current I3 derived by the temperature detection circuit 110. In the graph of FIG. 4(B), the horizontal axis represents temperature and the vertical axis represents a current value. In FIG. 4(B), since the current I1 is larger than the current I2 with the temperature of a point A of intersection between the current I1 and the current I2, and the current I3 appears on a high temperature side from the temperature of the point A, and increases as the temperature becomes higher. The temperature of the point A is determined by the current value of the current I1 or the current I2.

Figure 2:
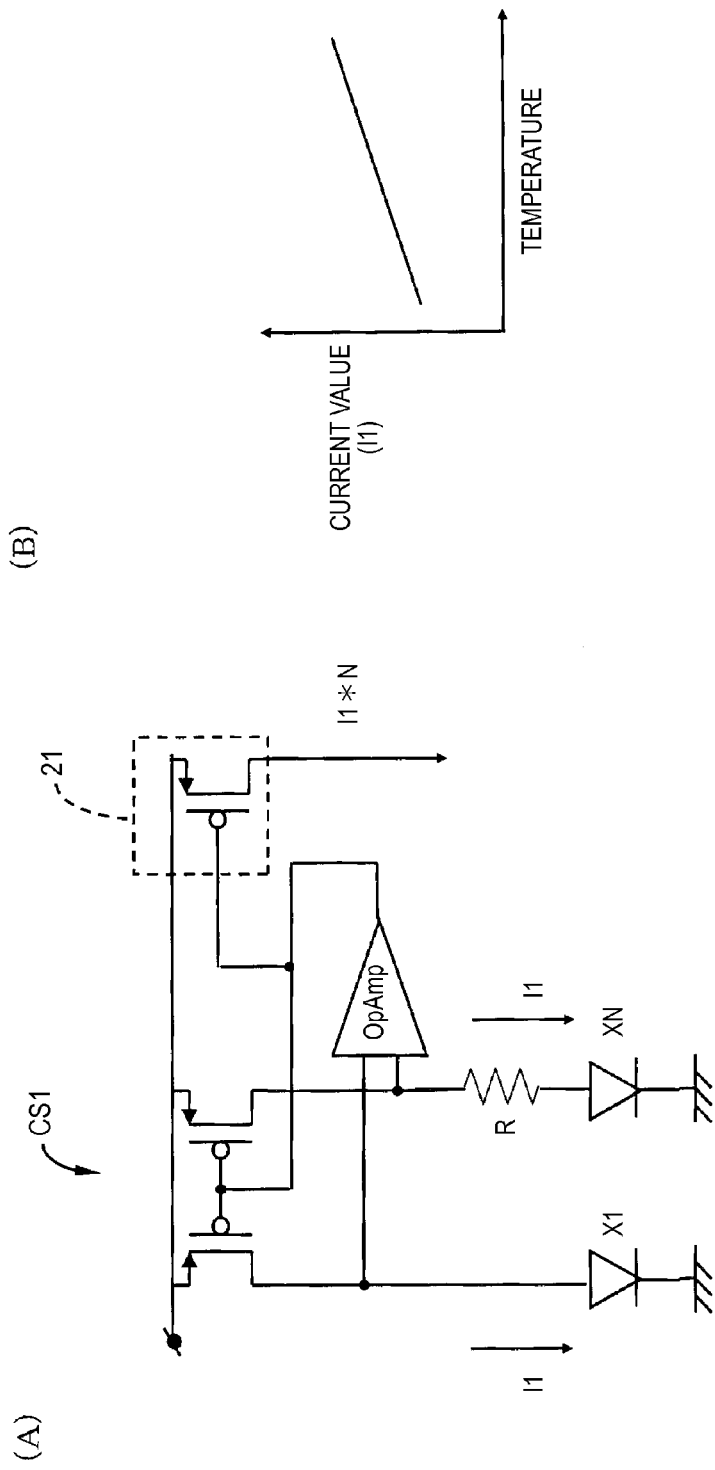
In FIG. 2, (A) is a circuit diagram showing a configuration example of a first current source in the first embodiment, and (B) is a schematic view showing an example of the characteristic of a current I1 to temperature in the first embodiment.
Figure 3:
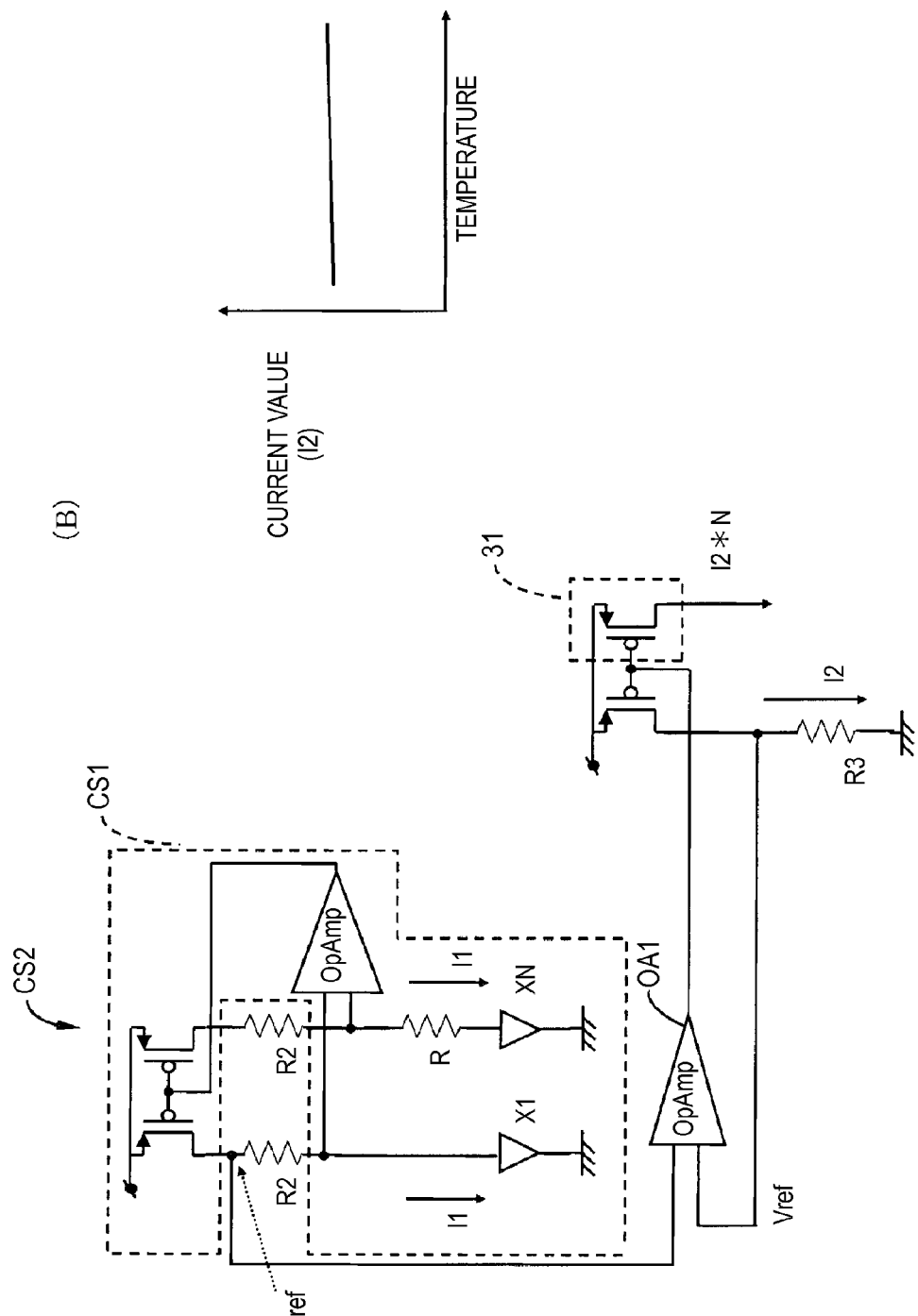
In FIG. 3, (A) is a circuit diagram showing a configuration example of a second current source in the first embodiment, and (B) is a schematic view showing an example of the characteristic of a current I2 to temperature in the first embodiment.

Accordingly, in the course of design of the compensation circuit 1000, circuit parameters of a circuit part 21 of FIG. 2 and a circuit part 31 of FIG. 3 are arbitrarily set, whereby it is possible to arbitrarily set the magnitude of the currents I1 and I2. Accordingly, it is possible to set the point A to arbitrary temperature.

In this way, the temperature detection circuit 110 derives the current I3 based on the difference between the current I1 and the current I2. With this, it is possible to arbitrarily set the temperature-current characteristic, and the degree of freedom of design is improved. The magnitude of the current I1 or the current I2 is adjusted at the time of design of the compensation circuit 1000, whereby it is possible to arbitrarily change the temperature position of the point A.

Next, the details of the manufacturing variation detection circuit 120 will be described.

As the manufacturing variation detection circuit 120, the configurations of four manufacturing variation detection circuits 120A to 120D are illustrated. When there is no need for distinction among the four configuration examples, the manufacturing variation detection circuits 120A to 120D are simply referred to as the manufacturing variation detection circuits 120.

Figure 5:
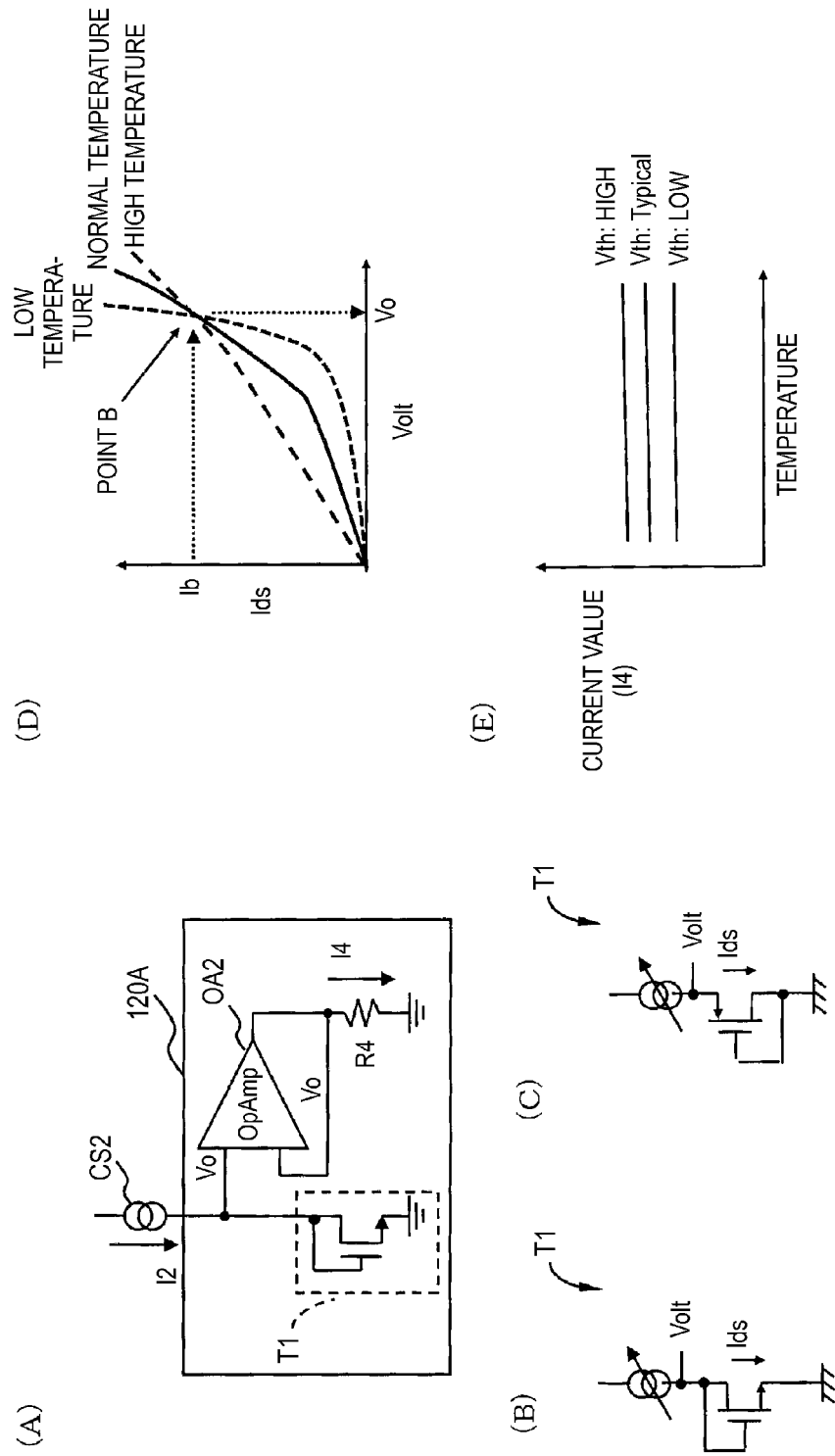
In FIG. 5, (A) is a circuit diagram showing a first configuration example of a manufacturing variation detection circuit in the first embodiment, (B) is a circuit diagram showing a configuration example of a transistor when a transistor of the manufacturing variation detection circuit in the first embodiment is an NMOS (Negative channel Metal Oxide Semiconductor), (C) is a circuit diagram showing a configuration example of a transistor when a transistor of the manufacturing variation detection circuit in the first embodiment is a PMOS (Positive channel Metal Oxide Semiconductor), (D) is a schematic view showing an example of the characteristic of a gate-source terminal voltage to a current flowing in a transistor for each temperature in the first embodiment, and (E) is a schematic view showing an example of the characteristic of a current I4 to temperature for each threshold voltage of a transistor in the first embodiment.

FIG. 5(A) is a circuit diagram showing a first configuration example of the manufacturing variation detection circuit 120 (a configuration example of the manufacturing variation detection circuit 120A). The manufacturing variation detection circuit 120A includes a transistor T1, an operational amplifier OA2, and a resistor R4.

FIG. 5(B) is a circuit diagram showing a configuration example of the transistor T1. As shown in FIG. 5(B), the transistor T1 has a source terminal connected to GND (ground). The transistor T1 has a gate and a drain which are connected to form an input terminal and an output terminal. In FIG. 5(B), although the transistor T1 is an NMOS, as shown in FIG. 5(C), the transistor T1 may be a PMOS.

The manufacturing variation detection circuit 120A detects manufacturing variation using the condition that a temperature coefficient which is one of the characteristics of the transistor becomes zero. When the temperature coefficient is zero (ZTC: Zero Temperature Coefficient), this means that the temperature coefficient is substantially constant to temperature.

Here, a method of searching for the condition that the temperature coefficient becomes zero will be described.

For example, a current Ids (applied current) is swept, and a gate-source voltage Volt of the transistor T1 is confirmed. The current Ids is a current which is applied to the transistor T1 whose gate and drain terminals are connected. A temperature condition at the time of current sweep is normal temperature (Typical), high temperature (temperature higher than normal temperature), and low temperature (temperature lower than normal temperature). Normal temperature is temperature (for example, 27° C.) at which the transistor can be operated as desired.

FIG. 5(D) is a schematic view of the behavior of the voltage Volt to the current Ids at normal temperature, high temperature, and low temperature. Here, voltage reference is made with current sweep. Referring to FIG. 5(D), the voltage Volt at each temperature of normal temperature, high temperature, and low temperature intersects at a predetermined point (point B) in the characteristic (an example of a first voltage-current characteristic) of the applied current and the output voltage.

When the current Ids at the point B is applied to the transistor T1 whose gate and drain terminals are connected, the gate-source voltage of the transistor T1 is generated to be the substantially constant voltage Volt to temperature. That is, in FIG. 5(A), when the current Ib at the point B is applied to the gate terminal and the drain terminal of the transistor T1 as the current I2, it is possible to acquire a substantially constant voltage Vo to temperature. The current Ib is an example of a first current, and the voltage Vo is an example of a first voltage.

Figure 6:
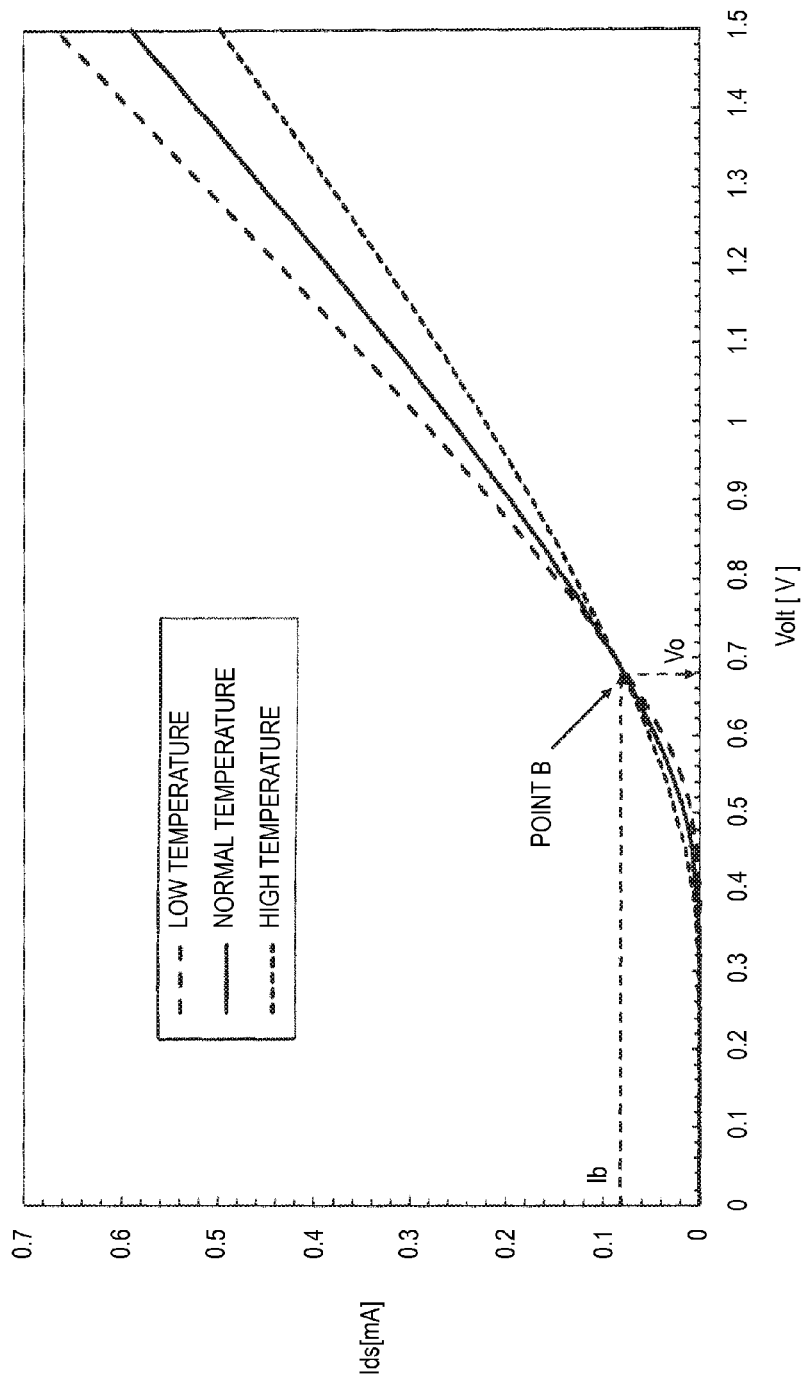
FIG. 6 is a schematic view showing an example of the characteristic of a gate-source voltage to a current flowing in a transistor when the threshold voltage of a transistor of the manufacturing variation detection circuit in the first embodiment is Typical.
Figure 7:
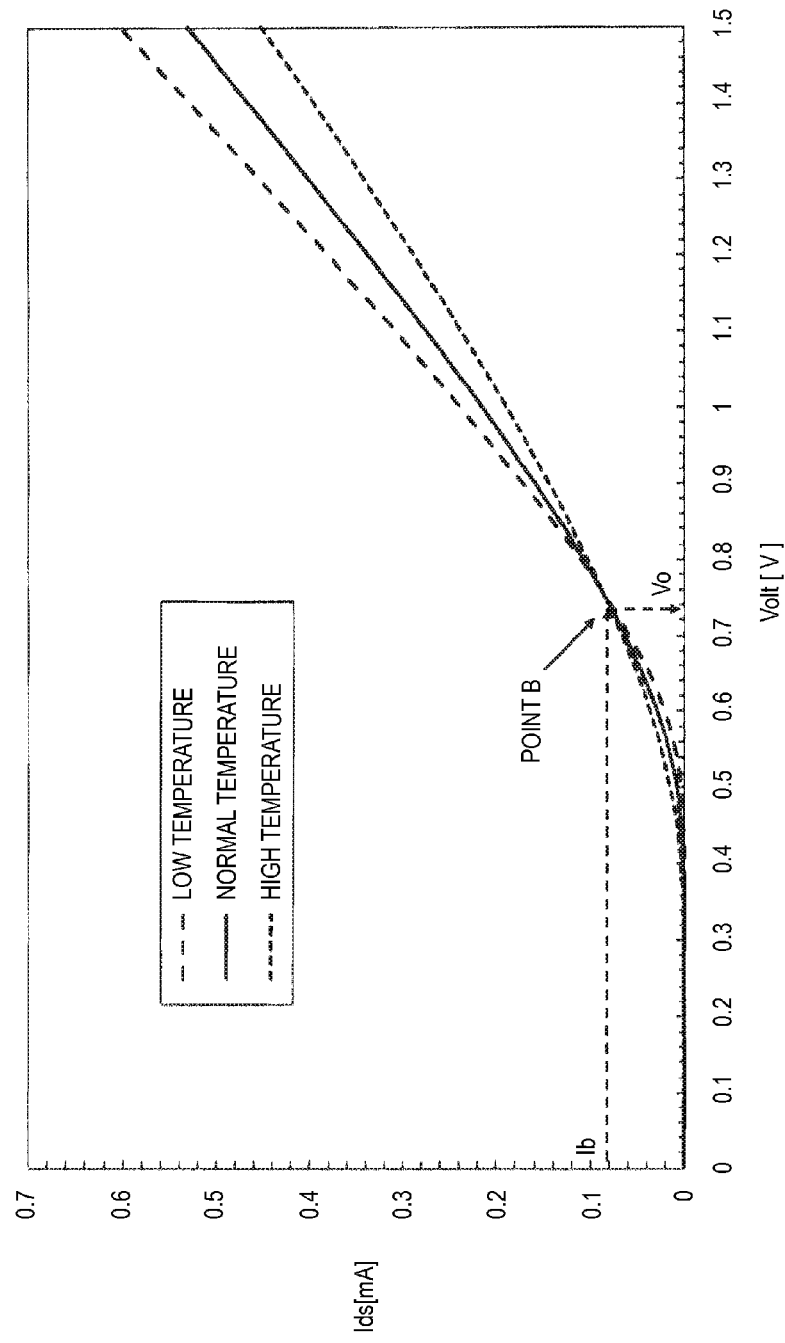
FIG. 7 is a schematic view showing an example of the characteristic of a gate-source voltage to a current flowing in a transistor when the threshold voltage of a transistor of the manufacturing variation detection circuit in the first embodiment is high.
Figure 8:
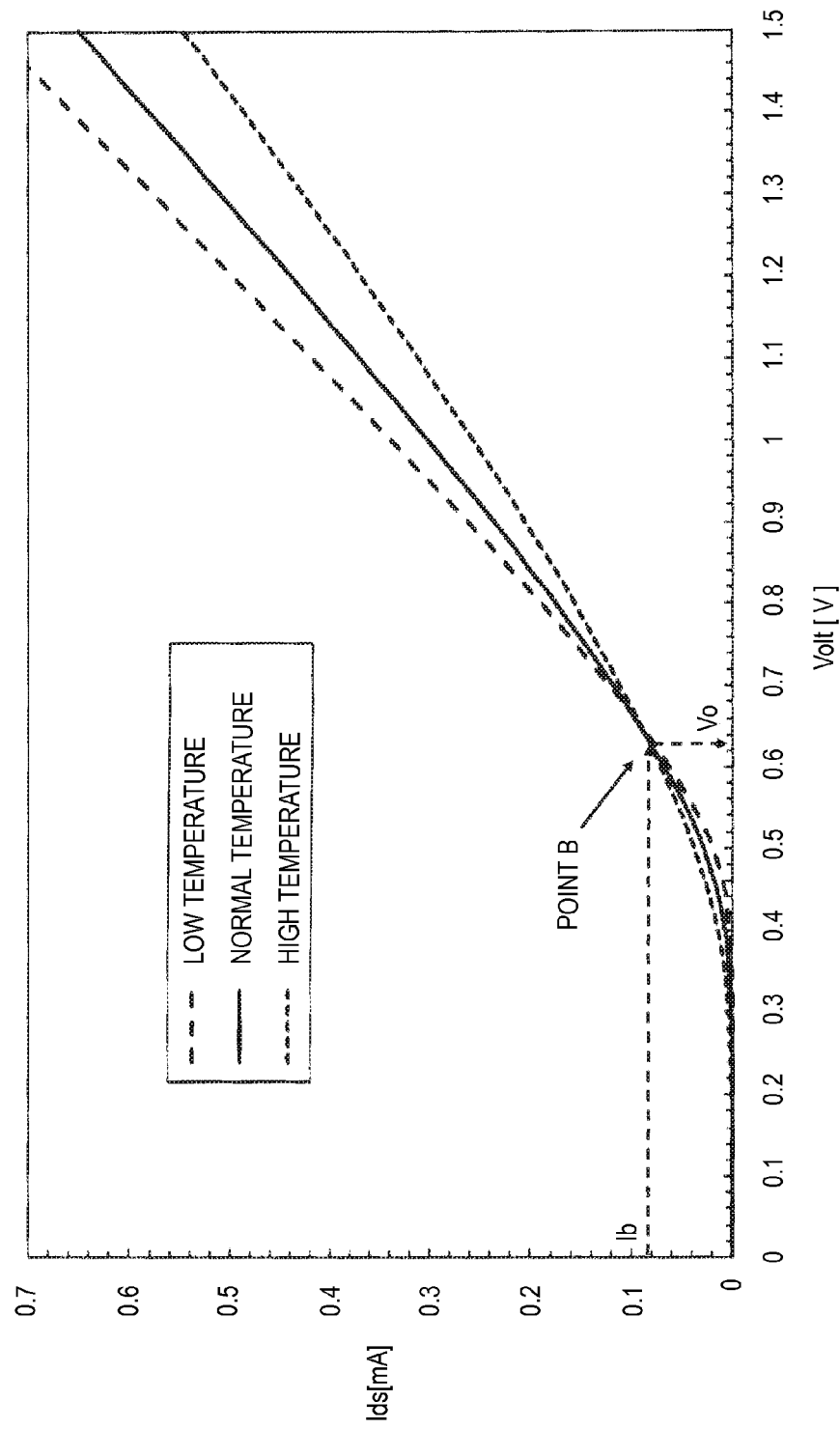
FIG. 8 is a schematic view showing an example of the characteristic of a gate-source voltage to a current flowing in a transistor when the threshold voltage of a transistor of the manufacturing variation detection circuit in the first embodiment is low.

FIG. 6 is a schematic view showing the relationship between the applied current Ids and the output voltage Volt when the threshold voltage Vth of the transistor T1 is Typical. FIG. 7 is a schematic view showing an example of the relationship between the applied current Ids and the output voltage Volt when the threshold voltage Vth of the transistor T1 is high. FIG. 8 is a schematic view showing an example of the relationship between the applied current Ids and the output voltage Volt when the threshold voltage Vth of the transistor T1 is low.

Referring to FIGS. 6 to 8, it can be understood that, even though the threshold voltage Vth is different in FIGS. 6 to 8, when a predetermined current (in this case, about 90 uA) is applied as the current Ids, in all cases, the point B which is the intersection point can be derived.

The voltage Vo which is obtained when the predetermined current Ib at the point B is applied to the transistor T1 is different in FIGS. 6 to 8. Specifically, the voltage Vo is highest when the threshold voltage Vth is high, the voltage Vo is second highest when the threshold voltage Vth is Typical, and the voltage Vo is lowest when the threshold voltage Vth is low.

When detecting manufacturing variation of the transistor T1, a specific current is applied to the transistor T1 in consideration of the results of FIGS. 6 to 8. That is, the current Ib is applied as the current I2 generated by the current source CS2 to the transistor T1 whose gate and drain terminals are connected, and the gate-source terminal voltage Vo is obtained as the output voltage of the transistor T1.

The gate-source terminal voltage Vo is applied to one input terminal of the operational amplifier OA2. The other input terminal and the output terminal of the operational amplifier OA2 are connected to the resistor R4. The voltage Vo is applied to the resistor R4 of FIG. 5, whereby a current I4 represented by Expression (4) is obtained. The current I4 is an example of a third current.

$$I4=Vo/R4 \qquad \text{Expression (4)}$$

The operational amplifier OA2 operates as a voltage follower. The operational amplifier OA2 is provided, whereby the output voltage Vo of the transistor T1 can be applied to the resistor R4 with no voltage drop.

When the threshold voltage Vth of the transistor T1 is high, the output voltage Vo to the applied current Ib of the transistor T1 is high, and thus the current I4 increases. When the threshold voltage Vth of the transistor T1 is low, the output voltage Vo to the applied current Ib of the transistor T1 is low, and thus the current I4 decreases. When the threshold voltage Vth of the transistor T1 is Typical, a characteristic between when the threshold voltage Vth is high and when the threshold voltage Vth is low is obtained.

FIG. 5(E) is a schematic view showing an example of the relationship between temperature and the current I4 for each threshold voltage Vth of the transistor T1. As shown in FIG. 5(E), a different temperature-current characteristic is obtained for each threshold voltage Vth of the transistor T1. Accordingly, it is possible to detect manufacturing variation in the threshold voltage Vth of the transistor T1 according to the magnitude of the current I4.

In this way, the manufacturing variation detection circuit 120A detects manufacturing variation based on the output voltage Vo obtained by the applied current Ib to the transistor T1. With this, since the output voltage Vo to the applied current Ib is substantially constant to change in temperature, manufacturing variation of the transistor T1 can be detected separately from the temperature characteristic. Accordingly, it is possible to improve compensation precision for manufacturing variations. As the manufacturing variations, manufacturing variations when the threshold voltage Vth is high, when the threshold voltage Vth is Typical, and when the threshold voltage Vth is low can be detected simultaneously.

The current Ib is a current which is applied to the transistor T1 to obtain the voltage Vo, and may be a current which obtains a voltage somewhat deviated from the voltage Vo. That is, a current in a predetermined range including the current Ib may be applied to the transistor T1, and a voltage around the voltage Vo may be acquired, thereby determining manufacturing variations.

Figure 9:
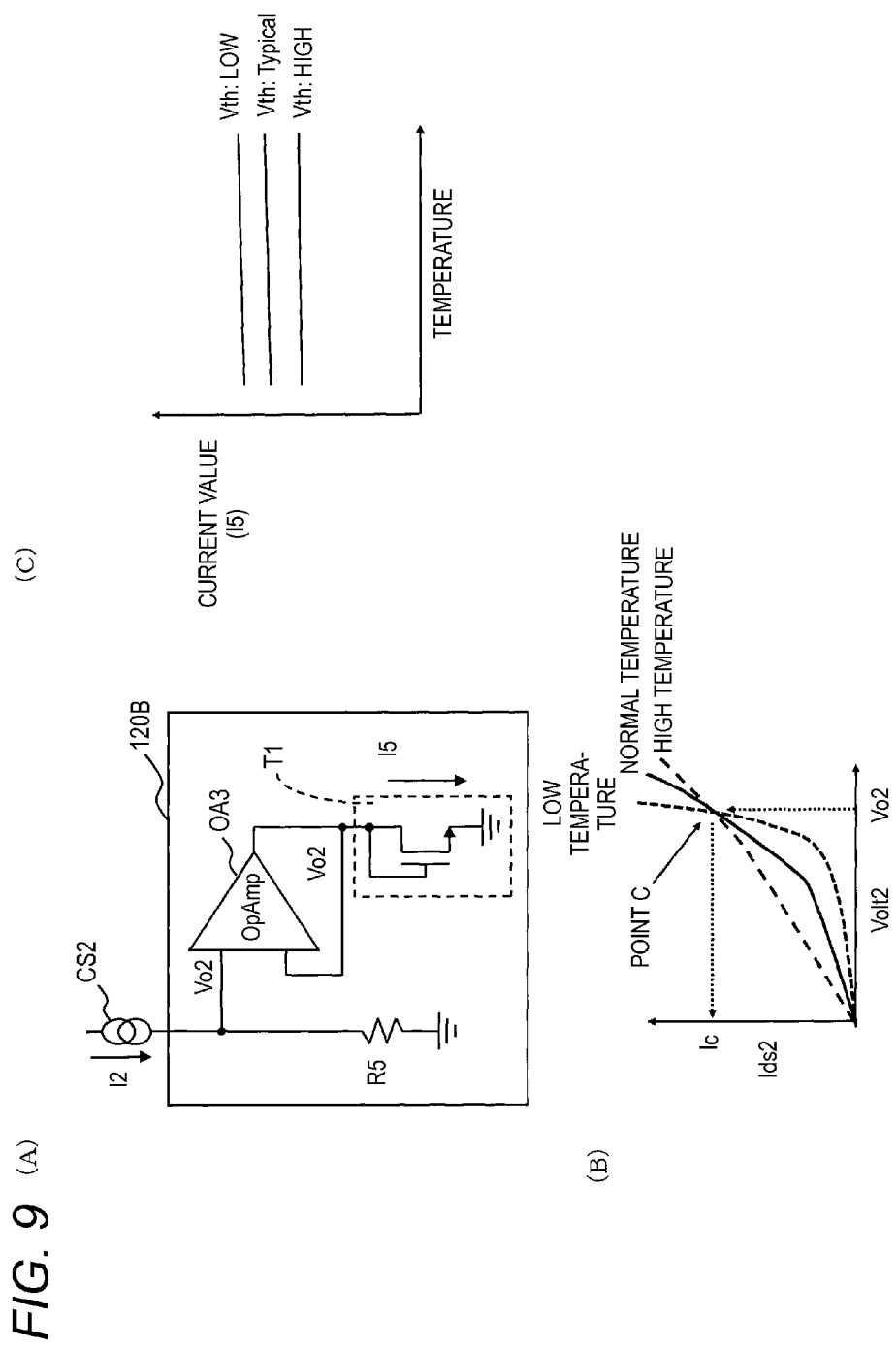
In FIG. 9, (A) is a circuit diagram showing a second configuration example of a manufacturing variation detection circuit in the first embodiment, (B) is a schematic view showing an example of the characteristic of a current flowing in a transistor to a gate-source terminal voltage for each temperature in the first embodiment, and (C) is a schematic view showing an example of the characteristic of a current I5 to temperature for each threshold voltage of a transistor in the first embodiment.

FIG. 9(A) is a circuit diagram showing a second configuration example of the manufacturing variation detection circuit 120B. In the second configuration example, the arrangement of the transistor T1 and the resistor is reversed compared to the first configuration example. The manufacturing variation detection circuit 120B includes a transistor T1, a resistor R5, and an operational amplifier OA3. While the configuration of the transistor T1 is the same as the configuration shown in FIGS. 5(B) and 5(C), in the second configuration example, the current Ids is substituted with a current Ids2 described below, and the voltage Volt is substituted with a voltage Volt2 described below.

Here, a method of searching the condition that the temperature coefficient becomes zero will be described.

The voltage Volt2 (applied voltage) applied to a terminal connecting the gate and the drain of the transistor T1 is swept, and the current Ids2 flowing in the transistor T1 whose the gate-drain terminals are connected is confirmed. A temperature condition at the time of voltage sweep is normal temperature, high temperature, and low temperature.

FIG. 9(B) is a schematic view showing the behavior of the current Ids2 to the voltage Volt2 at normal temperature, high temperature, and low temperature. Referring to FIG. 9(B), the current Ids2 at each temperature of normal temperature, high temperature, and low temperature intersects at a predetermined point (point C) in a characteristic (an example of a second voltage-current characteristic) of an applied voltage and an output current.

When the voltage Volt2 at the point C is applied between the gate and source of the transistor T1, the substantially constant current Ids2 to temperature flows in the transistor T1 whose gate and drain terminals are connected. That is, in FIG. 9(A), when a voltage Vo2 at the point C is applied to the gate terminal and the drain terminal of the transistor T1 as the voltage Volt2, it is possible to acquire a substantially constant current Ic to temperature. The voltage Vo2 is an example of a second voltage, and the current Ic is an example of a second current.

Figure 10:
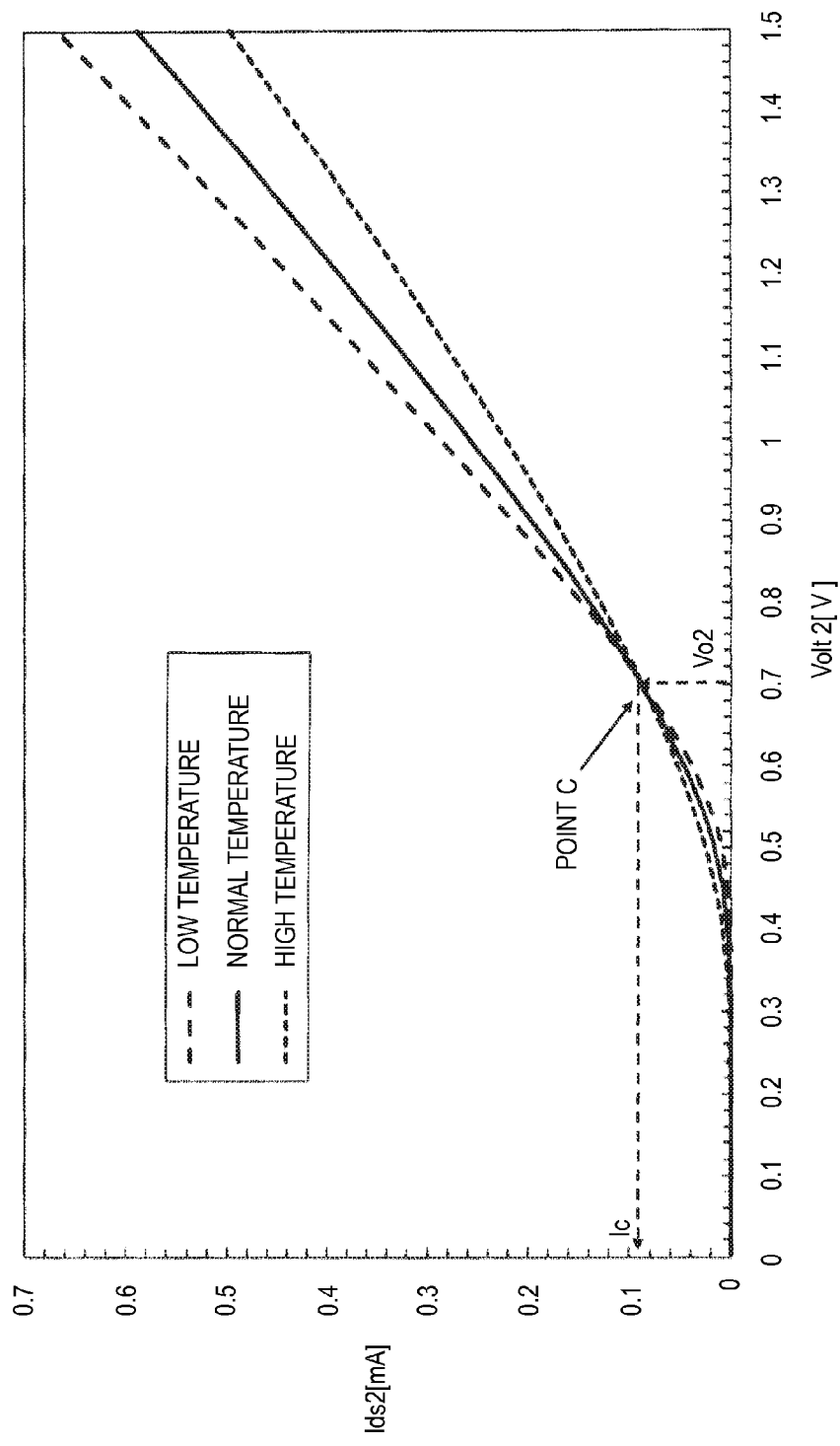
FIG. 10 is a schematic view showing an example of the characteristic of a current flowing in a transistor to a gate-source voltage when the threshold voltage of a transistor of the manufacturing variation detection circuit in the first embodiment is Typcal.
Figure 11:
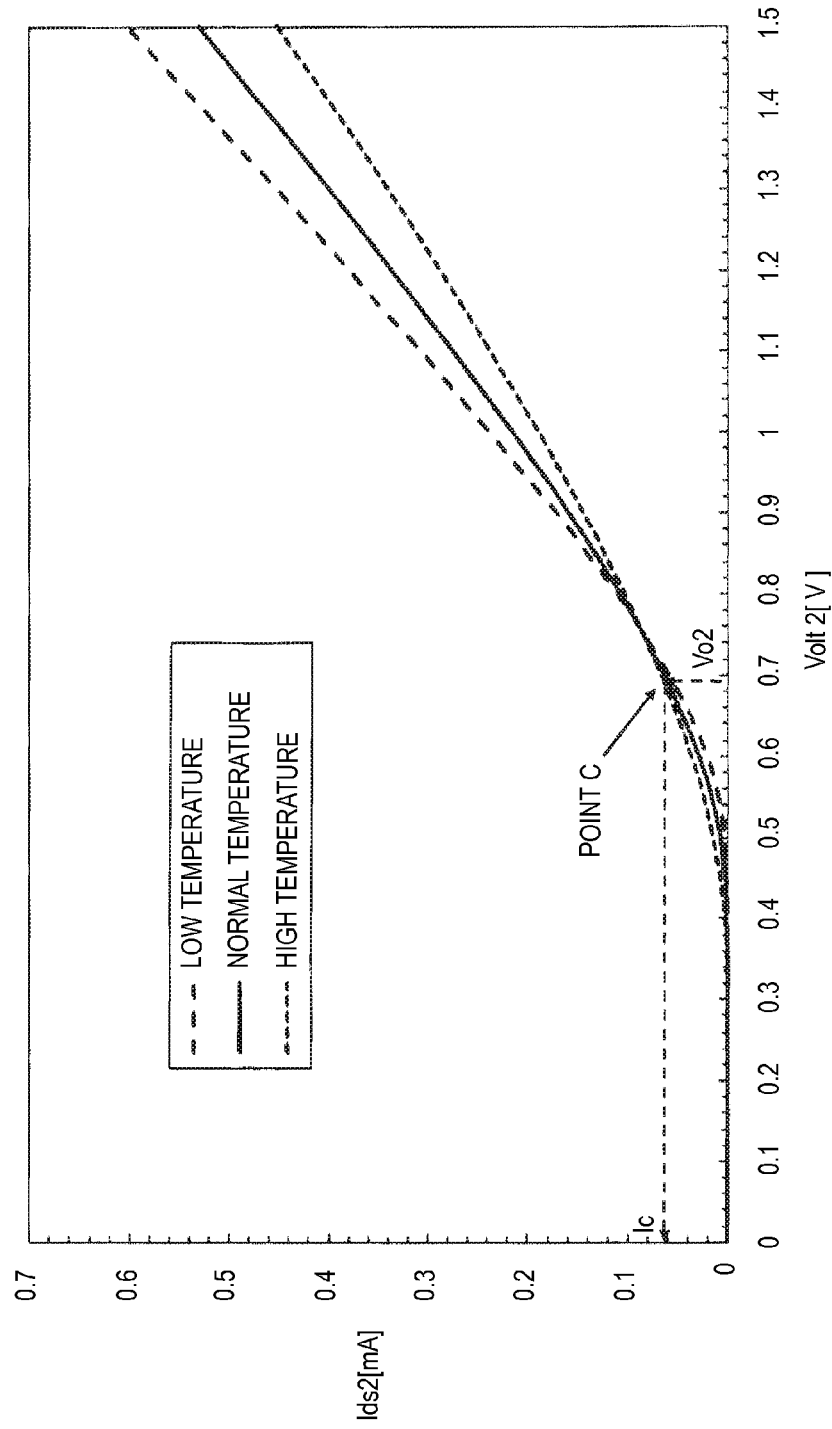
FIG. 11 is a schematic view showing an example of the characteristic of a current flowing in a transistor to a gate-source voltage when the threshold voltage of a transistor of the manufacturing variation detection circuit in the first embodiment is high.
Figure 12:
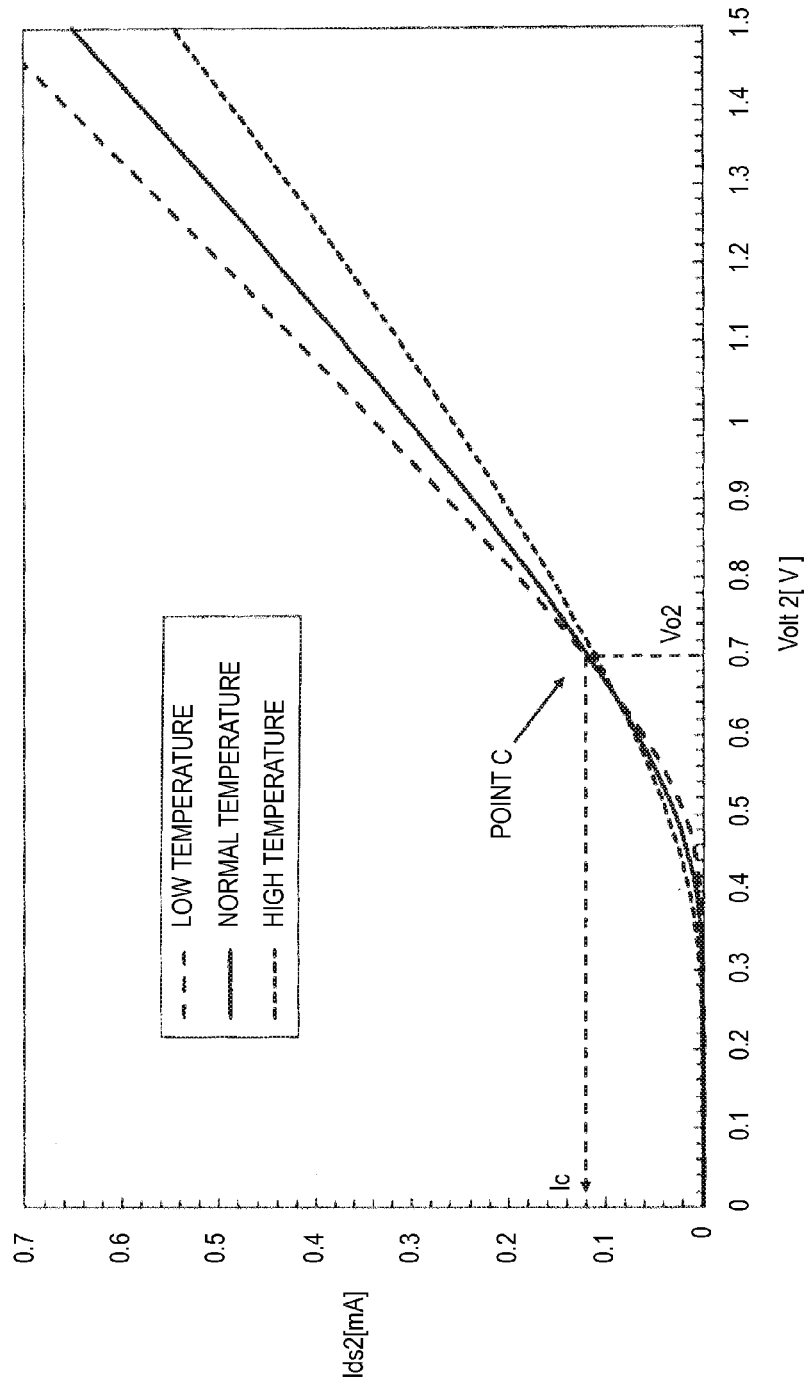
FIG. 12 is a schematic view showing an example of the characteristic of a current flowing in a transistor to a gate-source voltage when the threshold voltage of a transistor of the manufacturing variation detection circuit in the first embodiment is low.

FIG. 10 is a schematic view showing an example of the relationship between the applied voltage Volt2 and the output current Ids2 when the threshold voltage Vth of the transistor T1 is Typical. FIG. 11 is a schematic view showing an example of the relationship between the applied voltage Volt2 and the output current Ids2 when the threshold voltage Vth of the transistor T1 is high. FIG. 12 is a schematic view showing an example of the relationship between the applied voltage Volt2 and the output current Ids2 when the threshold voltage Vth of the transistor T1 is low.

Referring to FIGS. 10 to 12, it can be understood that, even though the threshold voltage Vth is different in FIGS. 10 to 12, when a predetermined voltage (for example, about 0.7 V as the voltage Vo2) is applied to the transistor T1, in all cases, the point C which is the intersection point can be derived.

The current Ic which is obtained when the predetermined voltage Vo2 at the point C is applied to the terminal connecting the gate and drain of the transistor T1 is different in FIGS. 10 to 12. Specifically, when the threshold voltage Vth is high, the current Ic is smallest, when the threshold voltage Vth is Typical, the current Ic is second smallest, and when the threshold voltage Vth is low, the current Ic is largest.

When detecting manufacturing variation of the transistor T1, a specific voltage (for example, 0.7 V) is applied to the transistor in consideration of the results of FIGS. 10 to 12.

In the manufacturing variation detection circuit 120B, the current I2 derived by Expression (2) flows in the resistor R5, and the voltage Vo2 is obtained. The voltage Vo2 is input to one input terminal of the operational amplifier OA3. The other input terminal and the output terminal of the operational amplifier OA3 are connected to the terminal connecting the gate and drain of the transistor T1.

The operational amplifier OA3 is provided, whereby the voltage Vo2 obtained through the resistor R5 can be applied to the terminal connecting the gate and drain of the transistor T1 with no voltage drop.

The terminal connecting the gate and drain of the transistor T1 is applied with the voltage Vo2 output from the operational amplifier OA3, and a current I5 (current Io) flowing in the transistor T1 whose gate and drain terminals are connected is obtained.

When the threshold voltage Vth of the transistor T1 is high, the output current I5 as the current Ic to the applied voltage Vo2 of the transistor T1 decreases. When the threshold voltage Vth of the transistor T1 is low, the output current I5 to the applied voltage Vo2 of the transistor T1 increases. When the threshold voltage Vth of the transistor T1 is Typical, a characteristic between when the threshold voltage Vth is high and when the threshold voltage Vth is low is obtained.

FIG. 9(C) is a schematic view showing an example of the relationship between temperature and the current I5 for each threshold voltage Vth of the transistor T1. As shown in FIG. 9(C), a different temperature-current characteristic is obtained for each threshold voltage Vth of the transistor T1. Accordingly, it is possible to detect manufacturing variation in the threshold. voltage Vth of the transistor T1 according to the magnitude of the current I5.

In this way, the manufacturing variation detection circuit 120B detects manufacturing variation based on the output current Ic obtained by the applied voltage Vo2 to the transistor T1. With this, since the output current Ic to the applied voltage Vo2 is substantially constant to change in temperature, it is possible to detect manufacturing variation of the transistor T1 separately from the temperature characteristic. Accordingly, it is possible to improve compensation precision for manufacturing variations. As the manufacturing variations, manufacturing variations when the threshold voltage Vth is high, when the threshold voltage Vth is Typical, and when the threshold voltage Vth is low can be detected. simultaneously.

The voltage Vo2 is a voltage which is applied to the transistor T1 to obtain the current Ic, and may be a voltage which obtains a current somewhat deviated from the current Ic. That is, a voltage in a predetermined range including the voltage Vo2 may be applied to the transistor and a current around the current Ic may be acquired, thereby determining manufacturing variations.

FIG. 13(A) is a diagram showing a third configuration example of the manufacturing variation detection circuit 120C. The manufacturing variation detection circuit 120C detects whether or not the threshold voltage Vth of the transistor T1 is high. The manufacturing variation detection circuit 120C is a circuit which subtracts the current I2 from the current I4 as represented by Expression (5).

$$I6=I4-I2 \qquad \text{Expression (5)}$$

In FIG. 13(A), although a configuration in which the manufacturing variation detection circuit 120C does not include the current source CS2 has been illustrated, the manufacturing variation detection circuit 120C may include the current source CS2. A circuit part relating to the subtraction of Expression (5) may be realized by a configuration different from FIG. 13(A) when the same characteristic is obtained.

In FIG. 13(A), a circuit which generates the current I4 is referred to as a current source CS3. The current source CS3 includes, for example, the manufacturing variation detection circuit 120A shown in FIG. 5.

As shown in FIG. 5(E), the current I4 has three patterns when the threshold voltage Vth is high, when the threshold voltage Vth is Typical, and when the threshold voltage Vth is low, and when the threshold voltage Vth is high, the current I4 increases. In FIG. 13(A), the current I2 generated by the current source CS2 is set to the same current as the current I4 when the threshold voltage Vth of the transistor T1 is Typical.

Accordingly, the current I6 is derived by Expression (5), and thus a temperature-current characteristic shown in FIG. 13(B) is obtained. FIG. 13(B) is a schematic view showing an example of the relationship between temperature and the current I6 in each manufacturing variation. As shown in FIG. 13(B), the output current I6 of the manufacturing variation detection circuit 120C flows when the threshold voltage Vth is high.

In this way, the manufacturing variation detection circuit 120C generates the current I6 which flows when the threshold voltage Vth is high. With this, as the manufacturing variations, manufacturing variation when the threshold voltage Vth is high can be detected. Even when the threshold voltage Vth is high, for example, a current is increased using the current I6, thereby obtaining a desired characteristic. For example, in application to millimeter-wave communication, when an amplifier is used as an example of an electric circuit, a desired gain is obtained.

FIG. 14(A) is a circuit diagram showing a fourth configuration example of the manufacturing variation detection circuit 120D. The manufacturing variation detection circuit 120D detects whether or not the threshold voltage Vth of the transistor T1 is low. The manufacturing variation detection circuit 120D is a circuit which subtracts the current I2 from the current I5 as represented by Expression (6).

$$I7=I5-I2 \qquad \text{Expression (6)}$$

In FIG. 14(A), although a configuration in which the manufacturing variation detection circuit 120D does not include the current source CS2 has been illustrated, the manufacturing variation detection circuit 120D may include the current source CS2. A circuit part relating to the subtraction of Expression (6) may be realized by a configuration different from FIG. 14(A) when the same characteristic is obtained.

In FIG. 14(A), a circuit which generates the current I5 is referred to as a current source CS4. The current source CS4 includes, for example, the manufacturing variation detection circuit 120B shown in FIG. 9.

As shown in FIG. 9(C), the current I5 has three patterns when the threshold voltage Vth is high, when the threshold voltage Vth is Typical, and when the threshold voltage Vth is low, and when the threshold voltage Vth is high, the current I5 decreases. In FIG. 14(A), the current I2 generated by the current source CS2 is set to the same current as the current I5 when the threshold voltage Vth of the transistor T1 is Typical.

Accordingly, the current I7 is derived by Expression (6), and thus a temperature-current characteristic shown in FIG. 14(B) is obtained. FIG. 14(B) is a schematic view showing an example of the relationship between temperature and the current I7 in each manufacturing variation. As shown in FIG. 14(B), the output current I7 of the manufacturing variation detection circuit 120D flows when the threshold voltage Vth is low.

In this way, the manufacturing variation detection circuit 120D generates the current I7 which flows when the threshold voltage Vth is low. With this, as the manufacturing variations, manufacturing variation when the threshold voltage Vth is low can be detected.

Next, the details of the voltage generation circuit 140 will be described.

Figure 15:
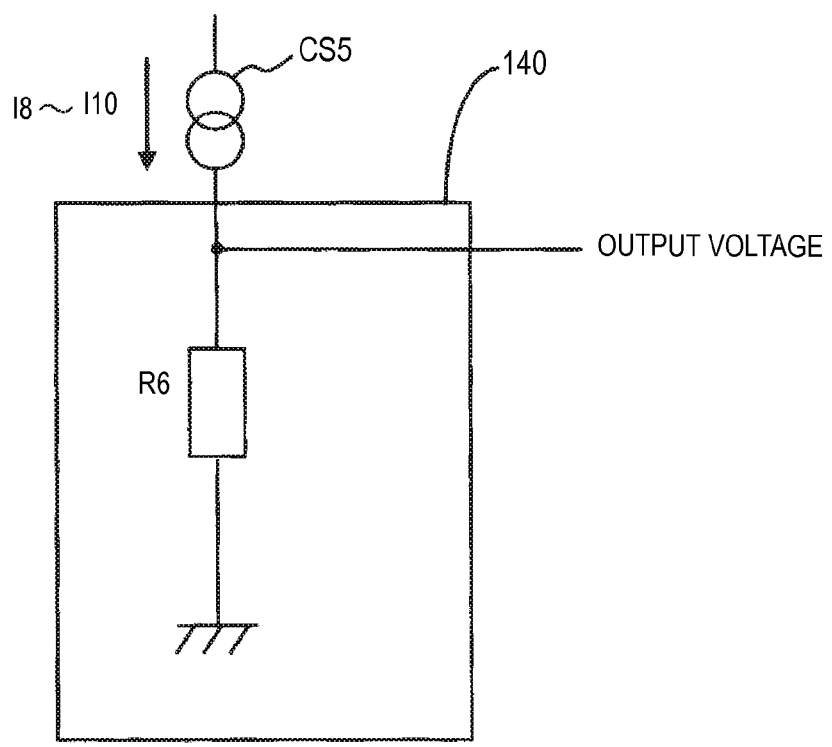
FIG. 15 is a circuit diagram showing a configuration example of a voltage generation circuit in the first embodiment.

FIG. 15 is a circuit diagram showing a configuration example of the voltage generation circuit 140. The voltage generation circuit 140 includes a resistor R6. A current I8 obtained by adding the currents I2, I3, and I4 as represented by Expression (7) flows in the resistor R6.

$$I8=I2+I3+I4 \quad \text{Expression (7)}$$

When the current I8 is used, it is assumed that the compensation circuit 1000 includes the manufacturing variation detection circuit 120A. The voltage generation circuit 140 generates and outputs an output voltage which is represented by the product of the current I8 and the resistor R6. The output voltage is supplied to an electric circuit which is arranged subsequent to the compensation circuit 1000 and includes a transistor.

In FIG. 15, a circuit which generates the current I8, a current I9, or a current I10 is referred to as a current source CS5. The current source CS5 includes, for example, the temperature detection circuit 110 and the manufacturing variation detection circuit 120.

Figure 16:
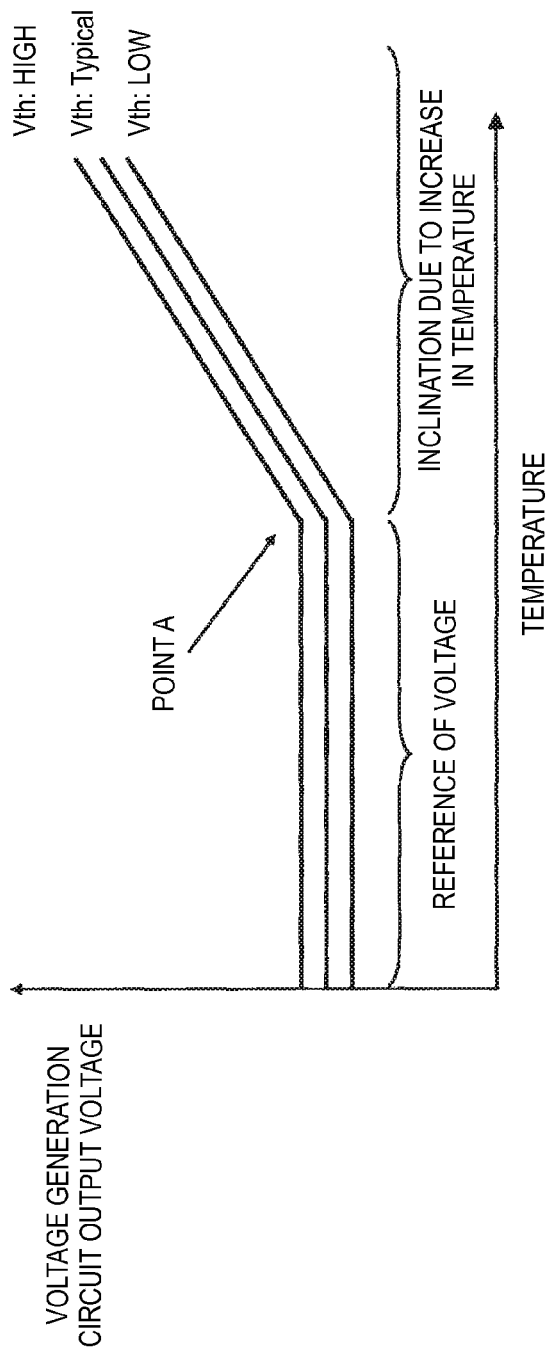
FIG. 16 is a schematic view showing a first example of the characteristic of an output voltage of the voltage generation circuit to temperature for each threshold voltage of a transistor in the first embodiment.

FIG. 16 is a schematic view showing an example of the relationship between temperature and the output voltage of the voltage generation circuit 140 when the current I8 is supplied to the voltage generation circuit 140. The voltage generation circuit 140 generates a reference of a voltage by the current I2, generates a voltage of an inclination component of an increase in temperature by the current I3, and generates a voltage including manufacturing variation by the current I4. With this, it is possible to generate a voltage according to the temperature characteristic and the manufacturing variation.

Figure 17:
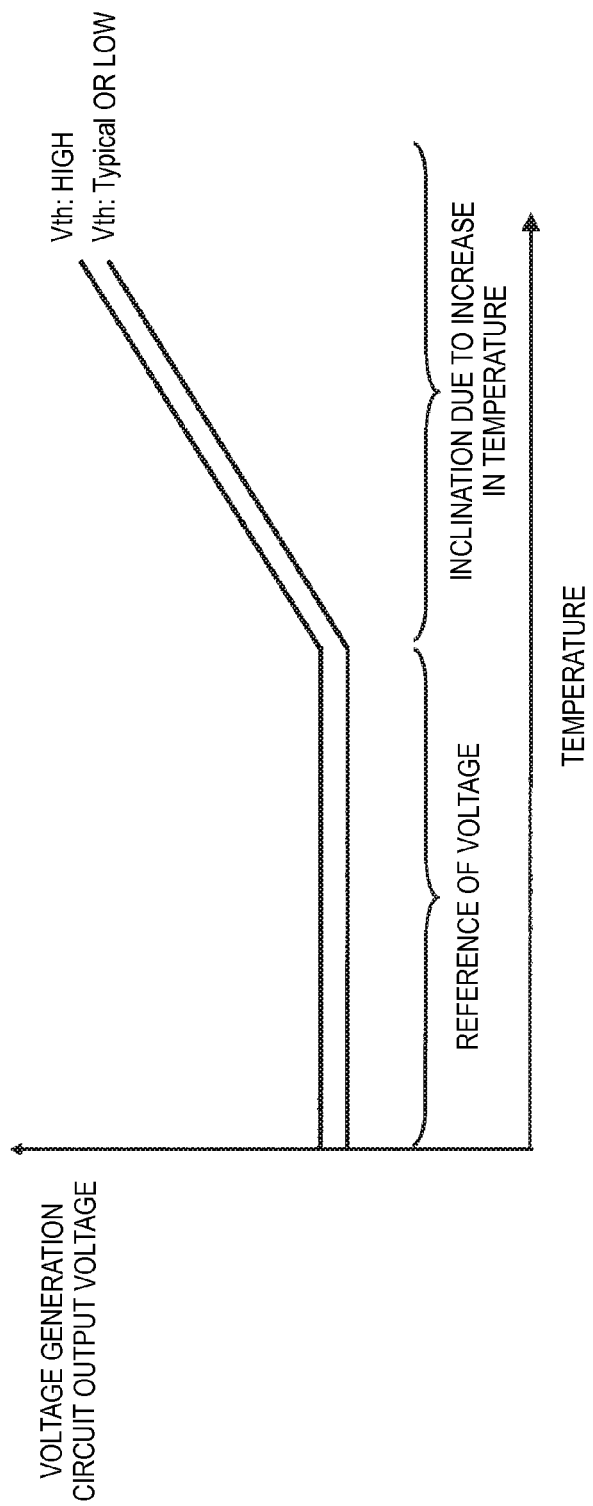
FIG. 17 is a schematic view showing a second example of the characteristic of an output voltage of the voltage generation circuit to temperature for each threshold voltage of a transistor in the first embodiment.

FIG. 17 is a schematic view showing an example of the relationship between temperature and the output voltage of the voltage generation circuit 140 when a current I9 represented by Expression (8) is supplied to the voltage generation circuit 140.

$$I9=I2+I3+I6 \quad \text{Expression (8)}$$

When the current I9 is used, it is assumed that the compensation circuit 1000 includes the manufacturing variation detection circuit 120C. The voltage generation circuit 140 generates a reference voltage by the current I2, generates a voltage of an inclination component of an increase in temperature by the current I3, and generates a voltage including manufacturing variation by the current I6. With this, it is possible to generate a voltage according to the temperature characteristic and manufacturing variation when the threshold voltage Vth is high.

Figure 18:
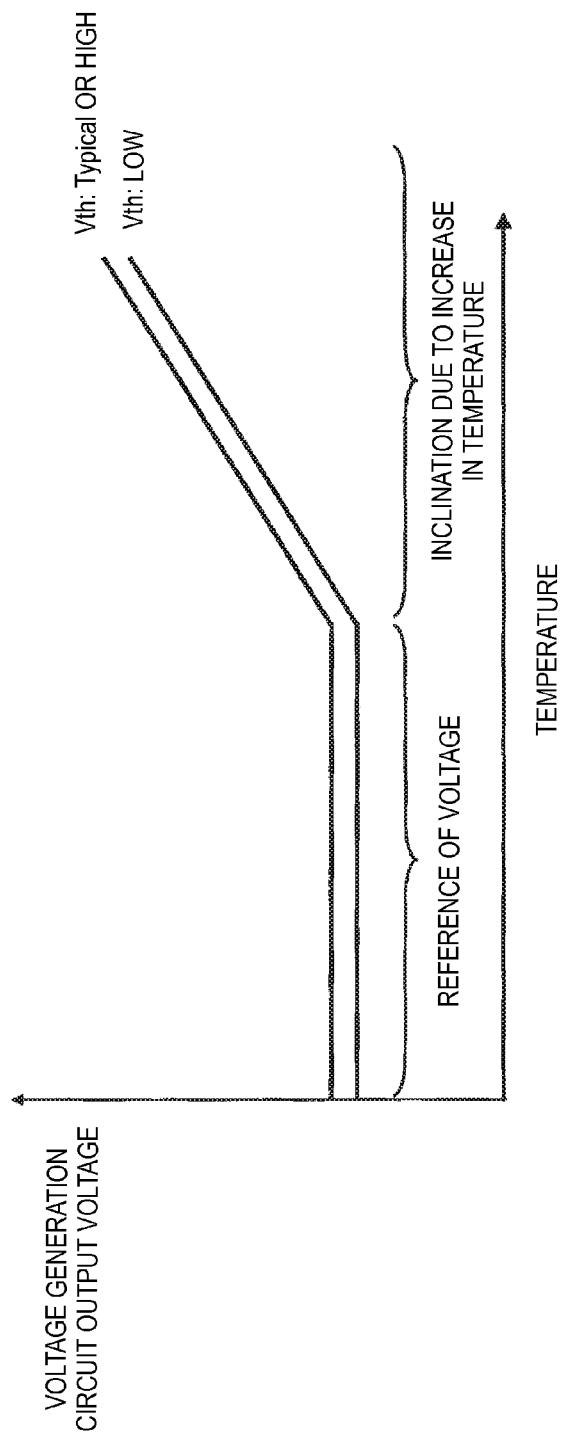
FIG. 18 is a schematic view showing a third example of the characteristic of an output voltage of the voltage generation circuit to temperature for each threshold voltage of a transistor in the first embodiment.

FIG. 18 is a schematic view showing an example of the relationship between temperature and the output voltage of the voltage generation circuit 140 when a current I10 represented by Expression (9) is supplied to the voltage generation circuit 140.

$$I10=I2+I3-I7 \quad \text{Expression (9)}$$

When the current I10 is used, it is assumed that the compensation circuit 1000 includes the manufacturing variation detection circuit 120D. The voltage generation circuit 140 generates a reference of a voltage by the current I2, generates a voltage of an inclination component of an increase in temperature by the current I3, and generates a voltage including manufacturing variation by the current I7. With this, it is possible to generate a voltage according to the temperature characteristic and manufacturing variation when the threshold voltage Vth is low.

In this way, the voltage generation circuit 140 receives the output currents of the temperature detection circuit 110 and the manufacturing variation detection circuit 120 together as input, and generates an output voltage. In this case, it is possible to change the output voltage of the voltage generation circuit 140 according to the magnitude of each of the currents I8, I9, and I10 supplied to the voltage generation circuit 140. Accordingly, it is possible to generate a voltage according to the temperature characteristic and the manufacturing variation.

Next, the overall configuration of the compensation circuit 1000 will be described.

Figure 19:
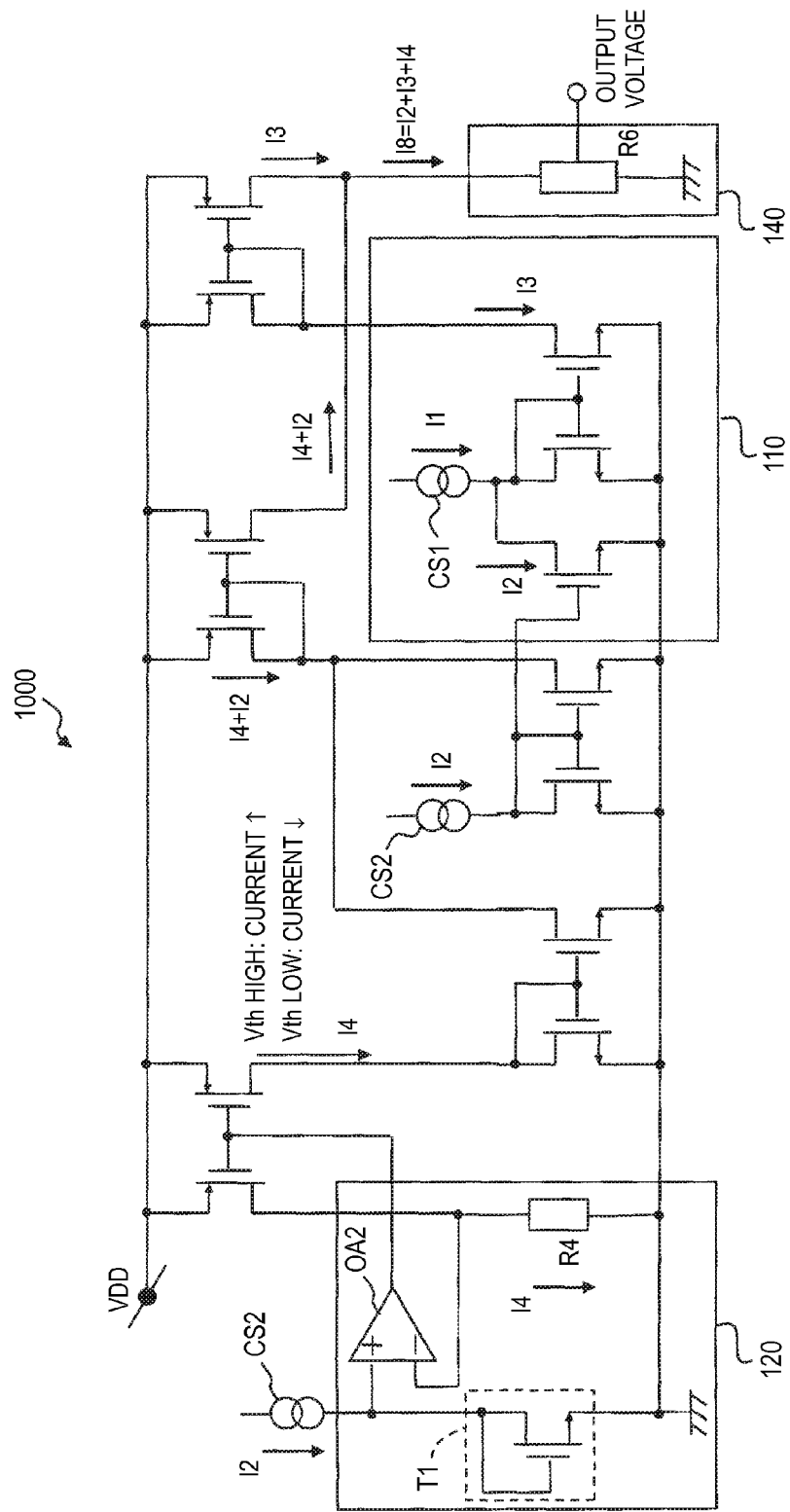
FIG. 19 is a circuit diagram showing an overall configuration example of the compensation circuit in the first embodiment.

FIG. 19 is a circuit diagram showing an overall configuration example of the compensation circuit 1000.

When determining the circuit configuration of the compensation circuit 1000, for example, a simulation which confirms the characteristic of the assumed compensation circuit 1000 is carried out. With the simulation, it is possible to confirm currents (for example, I8 to I10) which are input to the voltage generation circuit 140. The probability of the occurrence of manufacturing variations follows a normal distribution, and thus it is possible to desire a majority part of an IC to be manufactured with no manufacturing variations. A worst-case condition (for example, the maximum value or minimum value of the threshold value Vth of the transistor and the temperature characteristic) can be understood in the simulation. The simulation is repeated, whereby a circuit part other than the temperature detection circuit 110 and the manufacturing variation detection circuit 120, and respective parameters (for example, a current value, a voltage value, and a mixing ratio of respective currents) are designed. With this, a current which is input to the voltage generation circuit 140 is within a desired range.

A circuit configuration different from the configuration illustrated in FIG. 19 may be made when a desired characteristic of the compensation circuit 1000 is obtained.

According to the compensation circuit 1000, it is possible to compensate for the characteristic (for example, the temperature characteristic or characteristic due to manufacturing variation) of the transistor included in the electric circuit subsequent to the compensation circuit 1000 in advance and to make the electric circuit operate as desired.

Even when the threshold voltage Vth of the transistor is high or low, the compensation circuit 1000 is used to change the supply voltage, whereby the electric circuit subsequent to the compensation circuit 1000 has the same characteristic as when the threshold value Vth is Typical.

Even when temperature is high or low, the compensation circuit 1000 is used to change the supply voltage, whereby the electric circuit subsequent to the compensation circuit 1000 has the same characteristic as when the threshold value Vth is Typical.

For example, the temperature detection circuit 110 can perform adjustment such that the voltage is fixed from low temperature to normal temperature, and the voltage increases when temperature is high. That is, it is possible to improve the degree of freedom of design to temperature.

The temperature detection circuit 110 may be omitted. In this case, the compensation circuit 1000 supplies a voltage depending on manufacturing variation to the subsequent electric circuit. Accordingly, it is possible to suppress a characteristic depending on manufacturing variation in the subsequent electric circuit and to improve compensation precision for manufacturing variations.

The manufacturing variation detection circuit 120 may be omitted. In this case, the compensation circuit 1000 supplies a voltage depending on temperature to the subsequent electric circuit. Accordingly it is possible to suppress a characteristic depending on temperature in the subsequent electric circuit and to improve compensation precision for the temperature characteristic. Furthermore, it is possible to improve the degree of freedom of design to temperature in manufacturing an IC.

The respective current sources (current sources CS1, CS2, . . .) may be shared inside or outside the temperature detection circuit 110 and the manufacturing variation detection circuit 120, or may be provided separately.

(Second Embodiment)

Figure 20:
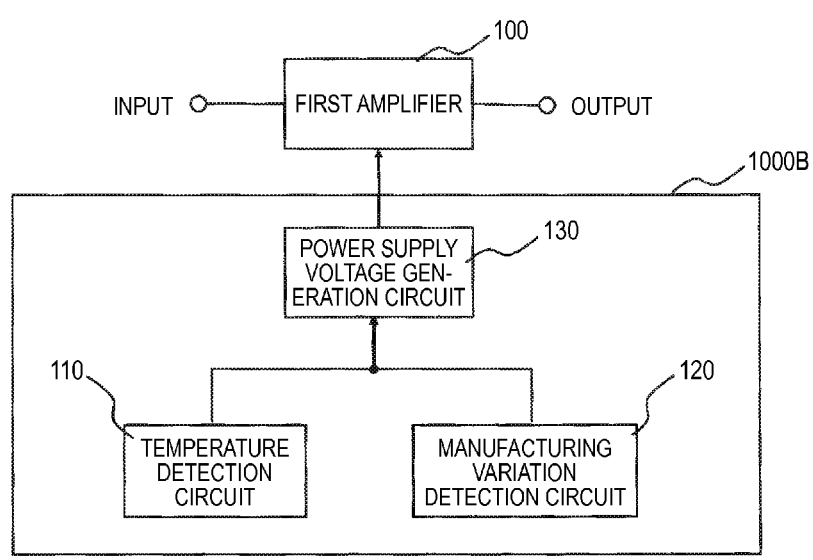
FIG. 20 is a block diagram showing a configuration example of a compensation circuit and a first amplifier in a second embodiment

FIG. 20 is a block diagram showing a configuration example of a compensation circuit 1000B and a first amplifier 100 in a second embodiment. The first amplifier 100 is an example of an electric circuit which is arranged subsequent to the compensation circuit 1000B.

The compensation circuit 1000B includes a temperature detection circuit 110, a manufacturing variation detection circuit 120, and a power supply voltage generation circuit 130. In the compensation circuit 1000B, the same parts as those of the compensation circuit 1000 in the first embodiment are represented by the same reference numerals, and description thereof will not be repeated or will be simplified. The power supply voltage generation circuit 130 includes LDO (Low Drop Out) as a power supply IC.

Figure 21:
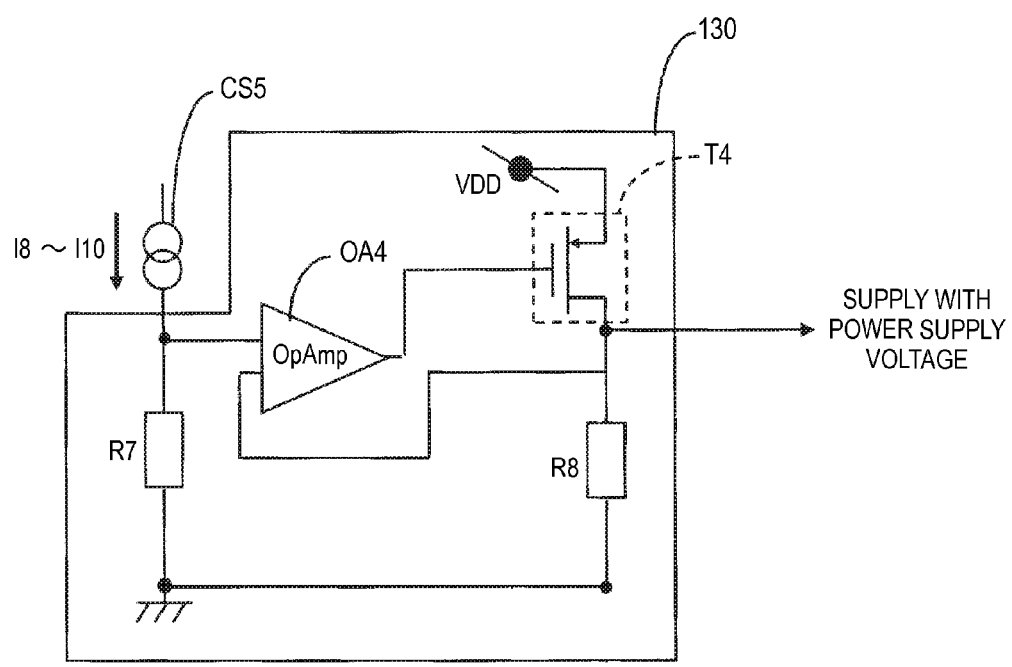
FIG. 21 is a circuit diagram showing a configuration example of a power supply voltage generation circuit in the second embodiment.

FIG. 21 is a circuit diagram showing a configuration example of the power supply voltage generation circuit 130. For example, the power supply voltage generation circuit 130 receives one of the currents I8 to I10 from the current source CS5 as input. Here, a case where an input current to the power supply voltage generation circuit 130 is the current I8 is illustrated.

The current I8 flows in a resistor R7, and a voltage which is input to one input terminal of an operational amplifier OA4 is determined by the product of the current I8 and the resistor R7. The other input terminal of the operational amplifier OA4 is connected to a resistor R8 and the drain terminal of a transistor T4. An output from the output terminal of the operational amplifier OA4 is applied to the gate terminal of the transistor T4, and the power supply voltage is output from the drain terminal of the transistor T4.

The relationship between temperature and the output voltage of the power supply voltage generation circuit 130 when the current I8 is supplied to the power supply voltage generation circuit 130 is the same as the characteristic shown in FIG. 16. The relationship between temperature and the output voltage of the power supply voltage generation circuit 130 when the current I9 is supplied to the power supply voltage generation circuit 130 is the same as the characteristic shown in FIG. 17. The relationship between temperature and the output voltage of the power supply voltage generation circuit 130 when the current I10 is supplied to the power supply voltage generation circuit 130 is the same as the characteristic shown in FIG. 18.

According to the power supply voltage generation circuit 130, it is possible to change the power supply voltage to be output according to the magnitude of the supplied current I8. Furthermore, it is possible to generate a voltage according to the temperature characteristic and manufacturing variation, and to improve the degree of freedom of design to temperature. Accordingly, it is possible to supply, to the first amplifier 100, the power supply voltage without depending on at least one of the temperature characteristic and manufacturing variation.

The first amplifier 100 applies the output voltage of the power supply voltage generation circuit 130 as the power supply voltage and performs predetermined amplification processing.

According to the first amplifier 100, it is possible to suppress variation in the output of the first amplifier 100 without depending on at least one of the temperature characteristic and manufacturing variation and to maintain the output of the first amplifier 100 substantially constant. In particular, when the first amplifier 100 is applied to millimeter-wave communication, while deterioration of a gain in a high frequency region increases due to manufacturing variation or change in the temperature characteristic, the power supply voltage from the power supply voltage generation circuit 130 is received, whereby it is possible to suppress deterioration of the gain.

(Third Embodiment)

Figure 22:
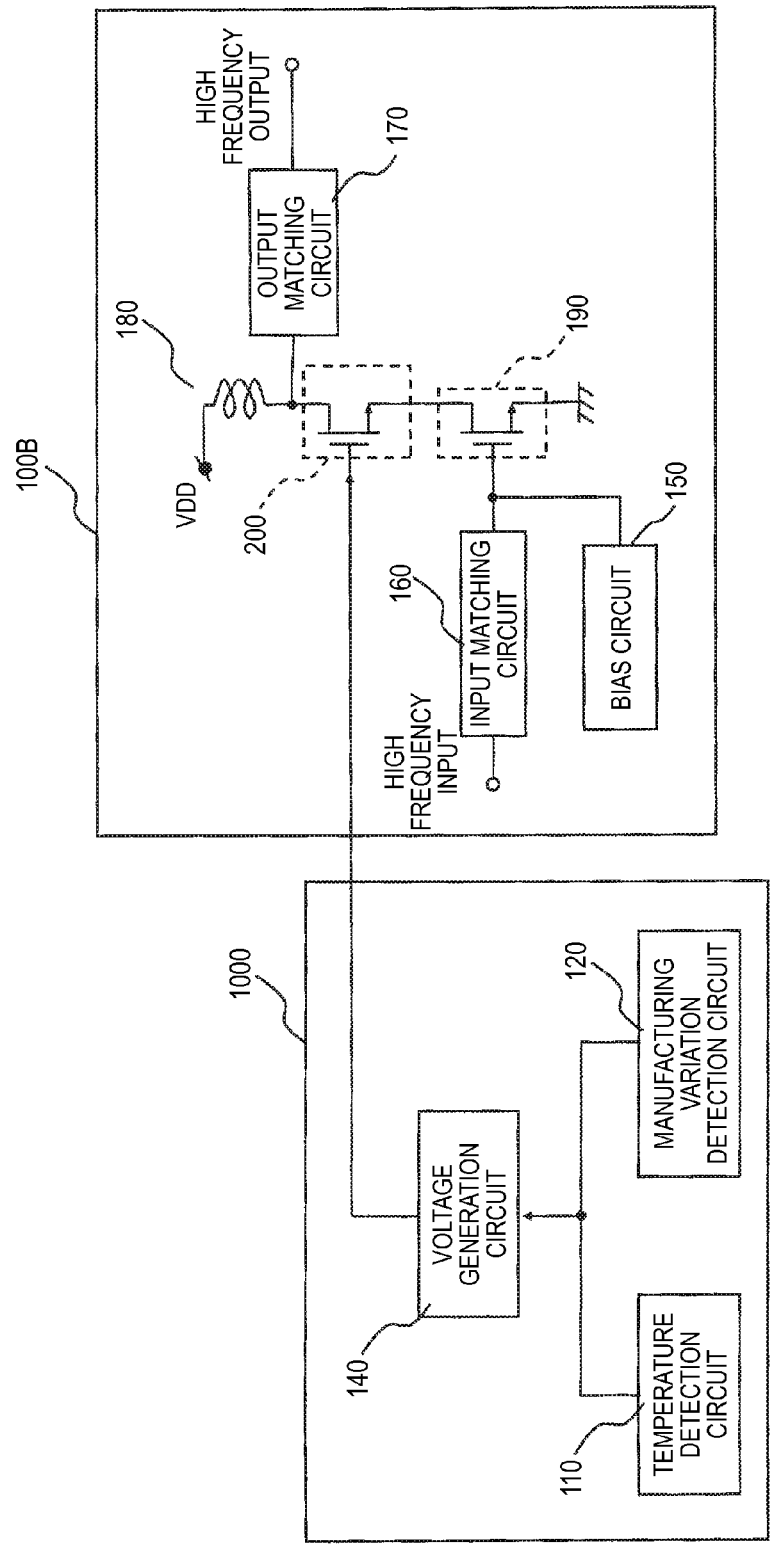
FIG. 22 is a block diagram showing a configuration example of a compensation circuit and a cascode power amplifier in a third embodiment.

FIG. 22 is a block diagram showing a configuration example of a compensation circuit 1000 and a cascode power amplifier 100B in a third embodiment. The cascode power amplifier 100B is an example of an electric circuit which is arranged subsequent to the compensation circuit 1000.

The cascode power amplifier 100B includes a bias circuit 150, an input matching circuit 160, an output matching circuit 170, a load inductor 180, a first transistor 190, and a second transistor 200.

The compensation circuit 1000 has the same configuration as the compensation circuit 1000 in the first embodiment. Thus, the same parts are represented by the same reference numerals, and description thereof will not be repeated.

The bias circuit 150 generates a predetermined bias voltage.

The input matching circuit 160 matches impedance when the input matching circuit 160 is viewed from a high frequency input terminal side and impedance when the input matching circuit 160 is viewed from the first transistor 190 side.

The output matching circuit 170 matches impedance when the output matching circuit 170 is viewed from a high frequency output terminal side and impedance when the output matching circuit 170 is viewed from the second transistor 200 side.

The load inductor 180 is a load element which is arranged between a power supply voltage VDD and the second transistor 200.

A high frequency signal is input from the high frequency input terminal and is input to the gate terminal of the first transistor 190 through the input matching circuit 160. The gate voltage of the first transistor 190 is determined and generated by the bias circuit 150.

The high frequency signal is input to the gate terminal of the first transistor 190 and is converted to a high frequency current by the first transistor 190. The high frequency current is converted to a voltage by the load inductor 180 connected to the drain terminal of the second transistor 200 and is output as a high frequency output through the output matching circuit 170.

The second transistor 200 controls the high frequency output by a gate voltage. The gate voltage of the second transistor 200 is generated by the output voltage of the voltage generation circuit 140.

Figure 23:
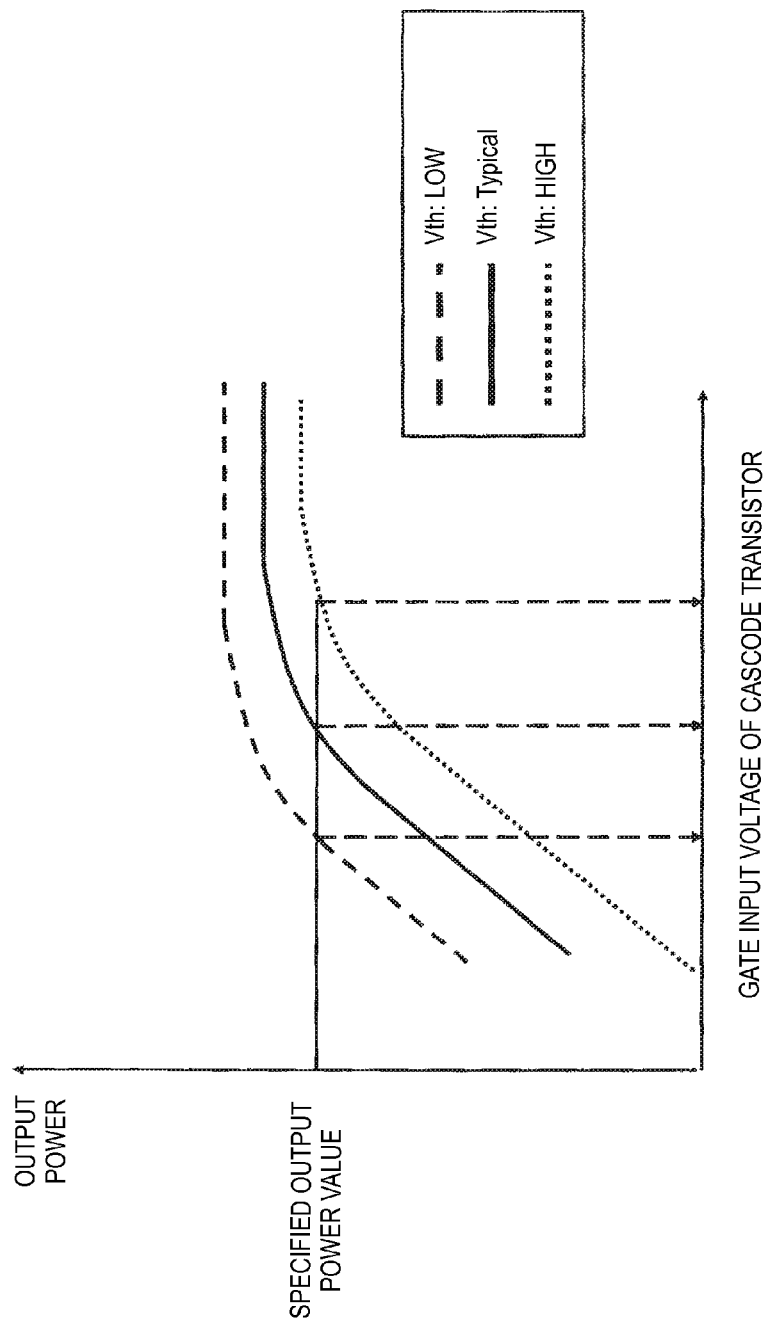
FIG. 23 is a schematic view showing an example of the characteristic of output power to a gate input voltage of a cascode transistor of a cascode power amplifier for each threshold voltage of a transistor in a cascode power amplifier of the related art.

FIG. 23 shows an output characteristic by manufacturing variation in a cascode power amplifier of the related art, and shows output power to a gate input voltage of a cascode transistor. The gate input voltage of the cascode transistor is a voltage which is applied to the gate terminal of the second transistor 200 when represented in the cascode power amplifier 100B.

Comparing when the threshold voltage Vth of each of the first transistor 190 and the second transistor 200 is high, when the threshold voltage Vth is Typical, and when the threshold voltage Vth is low, the gate input voltage of the cascode transistor for obtaining a predetermined specified output power value is largely different. That is, when there is manufacturing variation, when the gate input voltage of the cascode transistor is not largely changed, it is not possible to obtain a predetermined specified output power value.

Figure 24:
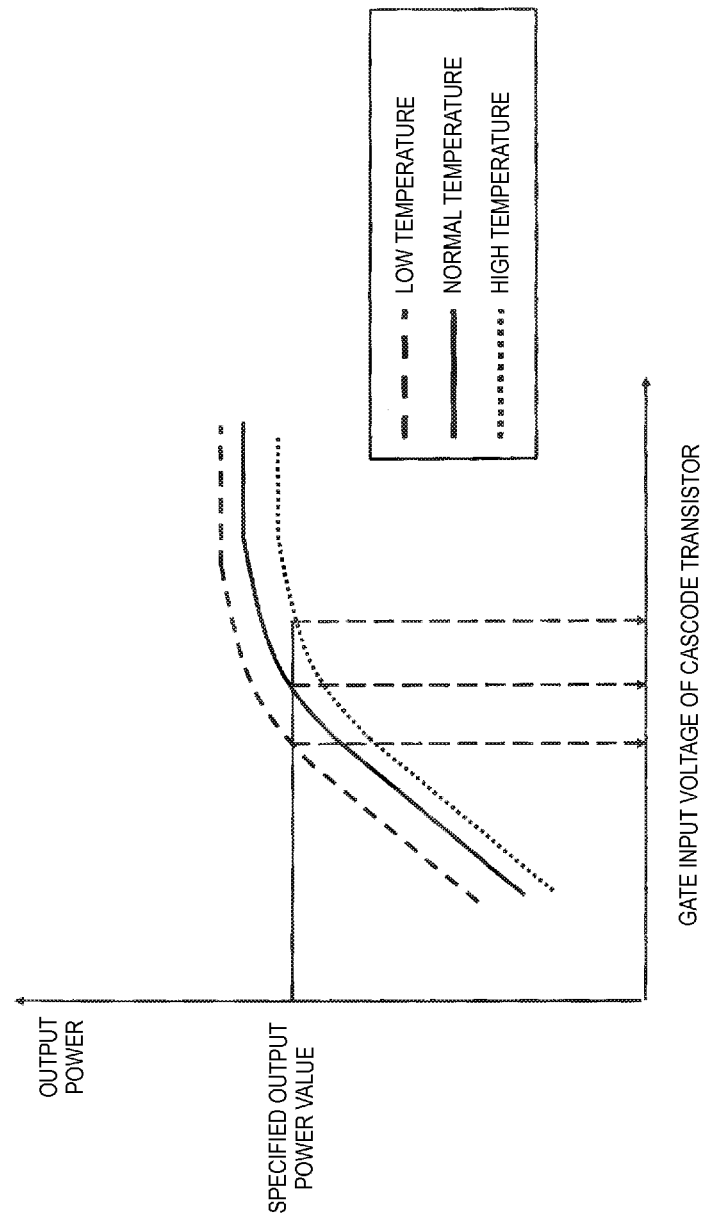
FIG. 24 is a schematic view showing an example of the characteristic of output power to a gate input voltage of a cascode transistor of a cascode power amplifier for each temperature in the related art.

FIG. 24 shows an output characteristic by a temperature characteristic of a cascode power amplifier of the related art, and shows output power to a gate input voltage of a cascode transistor.

Comparing when temperature is low, when temperature is Typical, and when temperature is high, the gate input voltage of the cascode transistor for obtaining a predetermined specified output power value is largely different. That is, when the temperature characteristic is different, when the gate input voltage of the cascode transistor is not largely changed, it is not possible to acquire a predetermined specified output power value.

In this way, in order to acquire a predetermined specified output power value, it is necessary to adjust the gate input voltage of the cascade transistor in both the manufacturing variation and the temperature characteristic. In contrast, as described in the first era the voltage generation circuit 140 generates a voltage including both the manufacturing variation and the temperature characteristic and outputs the voltage to the cascode power amplifier 100B. Accordingly, it is possible to adjust the gate input voltage of the cascade transistor as desired.

Next, the details of the voltage generation circuit 140 will be described.

For example, the voltage generation circuit 140 applies a current derived by Expression (10) to the resistor 6 shown in FIG. 15, thereby obtaining an output voltage.

$$I11 = I1 + I3 + I4 \quad \text{Expression (10)}$$

Figure 25:
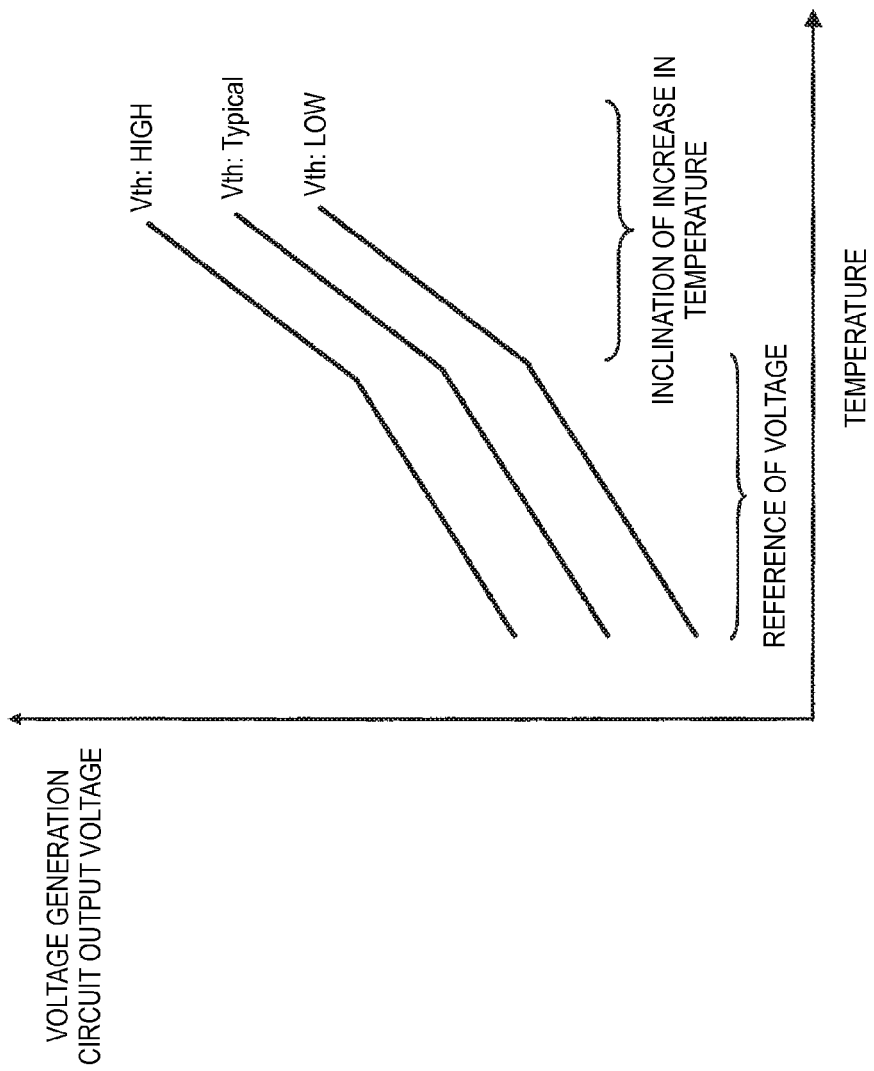
FIG. 25 is a schematic view showing an example of the characteristic of an output voltage of a voltage generation circuit to temperature for each threshold voltage of a transistor in the third embodiment.

FIG. 25 is a schematic view showing an example of the output voltage of the voltage generation circuit 140, to which the current I11 is supplied. The voltage generation circuit 140 generates a reference of a voltage by the current I1, generates a voltage of an inclination component of an increase in temperature by the current I3, and generates a voltage including manufacturing variation by the current I4. With this, it is possible to generate the gate input voltage of the cascade transistor according to the temperature characteristic and manufacturing variation.

According to the compensation circuit 1000, a voltage generated by the voltage generation circuit 140 is applied to the gate terminal of the second transistor 200 as the gate input voltage of the cascode transistor. The voltage has a characteristic inverse to the characteristic to temperature and the characteristic to manufacturing variation of the first transistor 190 and the second transistor 200. Accordingly, the cascade power amplifier 100B can maintain a power gain substantially constant without depending on at least one of the temperature characteristic and manufacturing variation and can maintain a high frequency output substantially constant.

The current I11 is an example of a current which is input to the voltage generation circuit 140. The current I11 may have a different current value when the cascode power amplifier 100B does not depend on at least one of the temperature characteristic and manufacturing variation.

(Fourth Embodiment)

Figure 26:
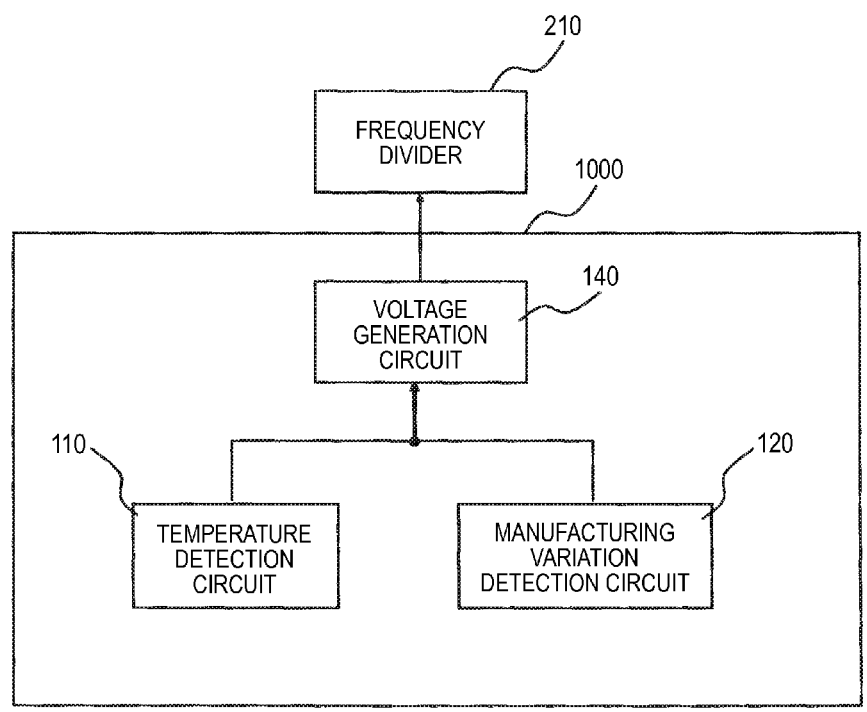
FIG. 26 is a block diagram showing a configuration example of a compensation circuit and a frequency divider in a fourth embodiment.

FIG. 26 is a block diagram showing a configuration example of a compensation circuit 1000 and a frequency divider 210 in a fourth embodiment. In FIG. 26, the output voltage of the voltage generation circuit 140 is given to the frequency divider 210. The frequency divider 210 is an example of an electric circuit which is arranged subsequent to the compensation circuit 1000.

The compensation circuit 1000 has the same configuration as the compensation circuit 1000 in the first embodiment. Thus, the same parts are represented by the same reference numerals, and description thereof will not be repeated.

Figure 27:
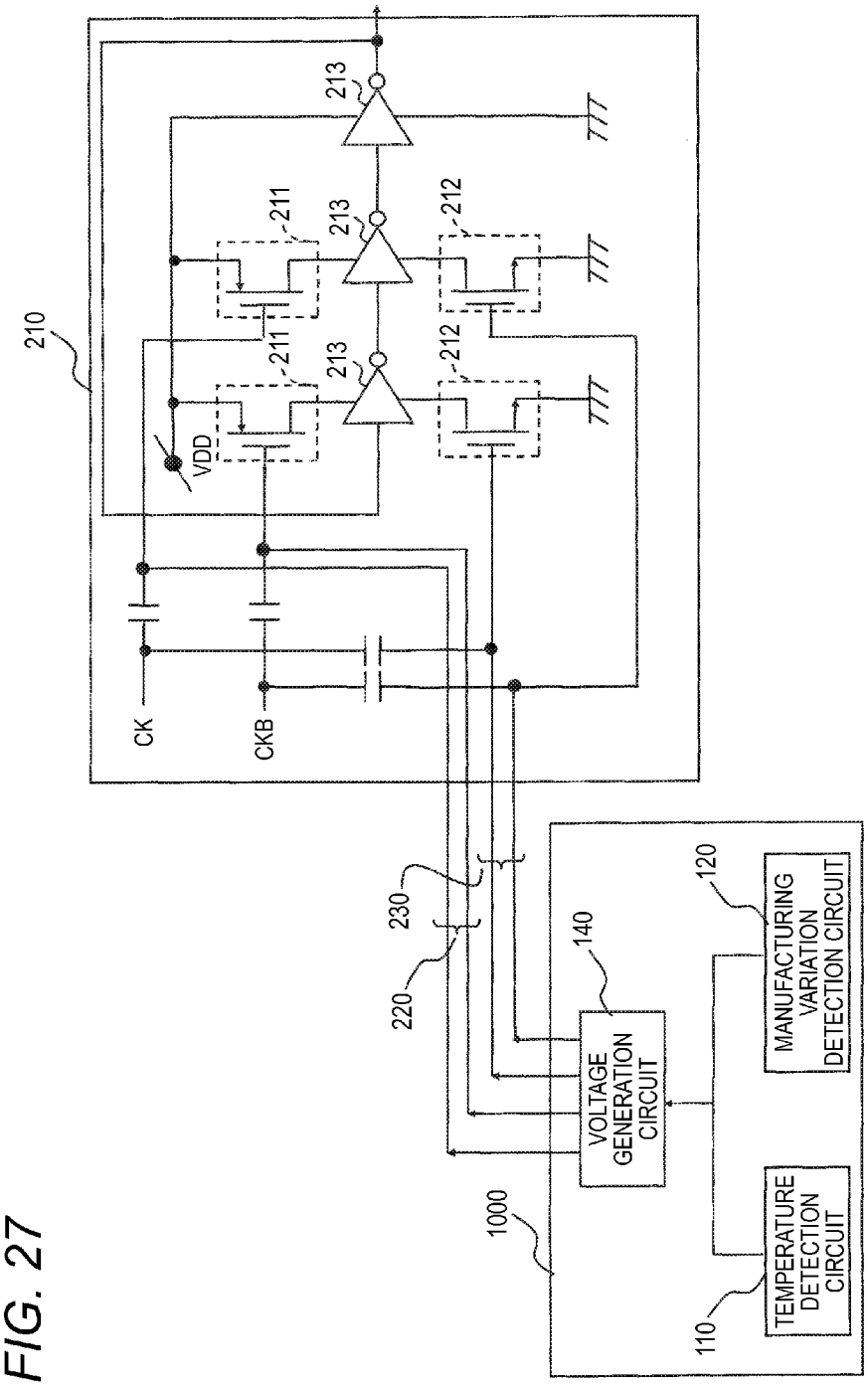
FIG. 27 is a schematic view showing a configuration example of the compensation circuit and a circuit configuration example of the frequency divider in the fourth embodiment.

FIG. 27 is a schematic view showing a configuration example of the compensation circuit 1000 and a circuit configuration example of the frequency divider 210. The frequency divider 210 includes a PMOS 211, an NMOS 212, and an inverter 213. The output voltage of the voltage generation circuit 140 is applied as the bias voltage of each of the PMOS 211 and the NMOS 212. In FIG. 27, the final stage output of the inverter 213 is fed back to the first stage input of the inverter 213. Clock signals are input from clock terminals CK and CKB.

The frequency division sensitivity of the frequency divider 210 is determined by currents flowing in the the PMOS 211 and the NMOS 212 by a bias voltage 220 of the PMOS 211 and a bias voltage 230 of the NMOS 212.

For example, the bias voltage 220 of the PMOS 211 is set to be lower than the bias voltage 230 of the NMOS 212, and the bias voltage 220 and the bias voltage 230 are applied. In this case, a current flowing in a circuit inside the frequency divider 210 increases and frequency division sensitivity is improved.

The bias voltage 220 of the PMOS 211 is set to be higher than the bias voltage 230 of the NMOS 212, and the bias voltage 220 and the bias voltage 230 are applied. In this case, a current flowing in a circuit inside the frequency divider 210 decreases and frequency division sensitivity is lowered.

Figure 28:
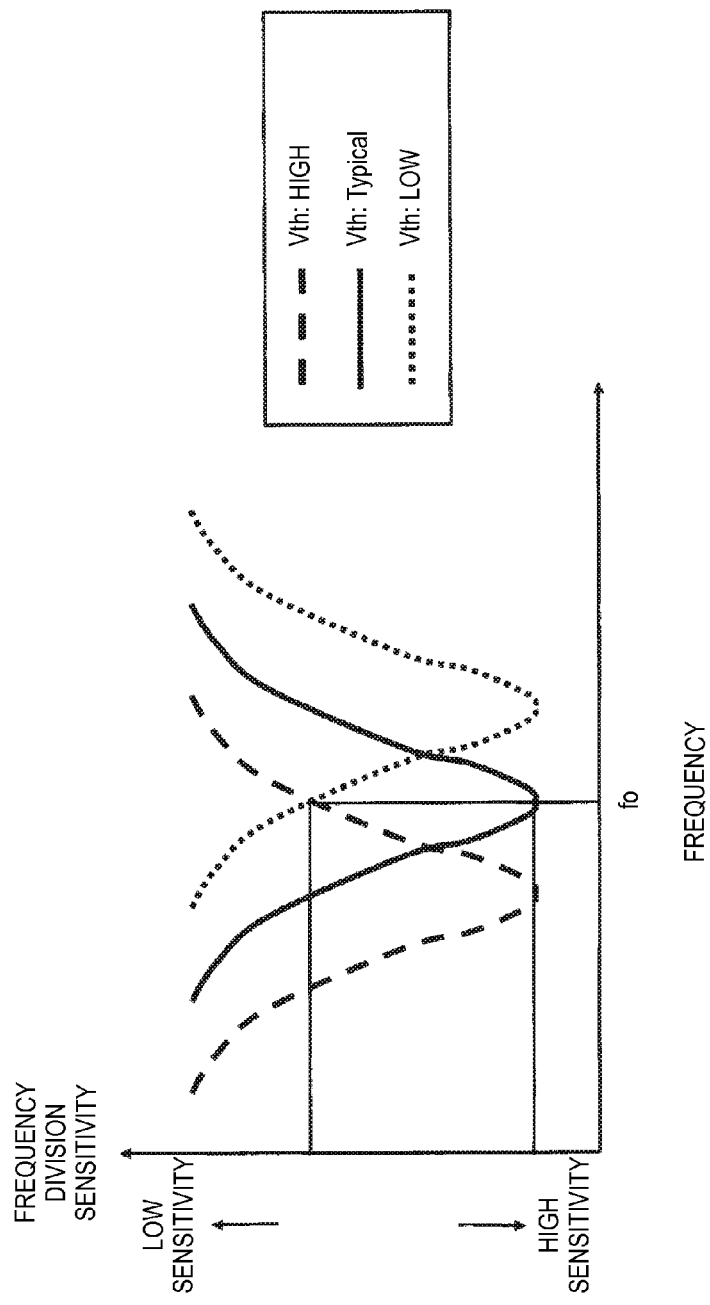
FIG. 28 is a schematic view showing an example of the characteristic of frequency division sensitivity to frequency for each threshold voltage of a transistor in a frequency divider of the related art.

FIG. 28 is a schematic view showing a sensitivity characteristic by manufacturing variation of a circuit of a frequency divider of the related art and showing an example of frequency division sensitivity to frequency. Comparing when the threshold voltage Vth is high, when the threshold voltage Vth is Typcal, and when the threshold voltage Vth is low, it is possible to divide a frequency fo with high sensitivity when the threshold voltage Val is Typcal.

As shown in FIG. 28, when dividing the frequency fo in a state where the threshold voltage Vth is high or low without taking into consideration manufacturing variation of the PMOS 211 and the NMOS 212, sensitivity is lowered compared to the state of Typcal, and the frequency may not be divided. When the threshold voltage Vth is high, the current flowing in the circuit of the frequency divider 210 is increased, whereby it is possible to divide the frequency with the same frequency division sensitivity as the state of Typical. When the threshold voltage Vth is low, the current flowing in the circuit of the frequency divider 210 is decreased, whereby it is possible to divide the frequency with the same frequency division sensitivity as the state of Typical.

Figure 29:
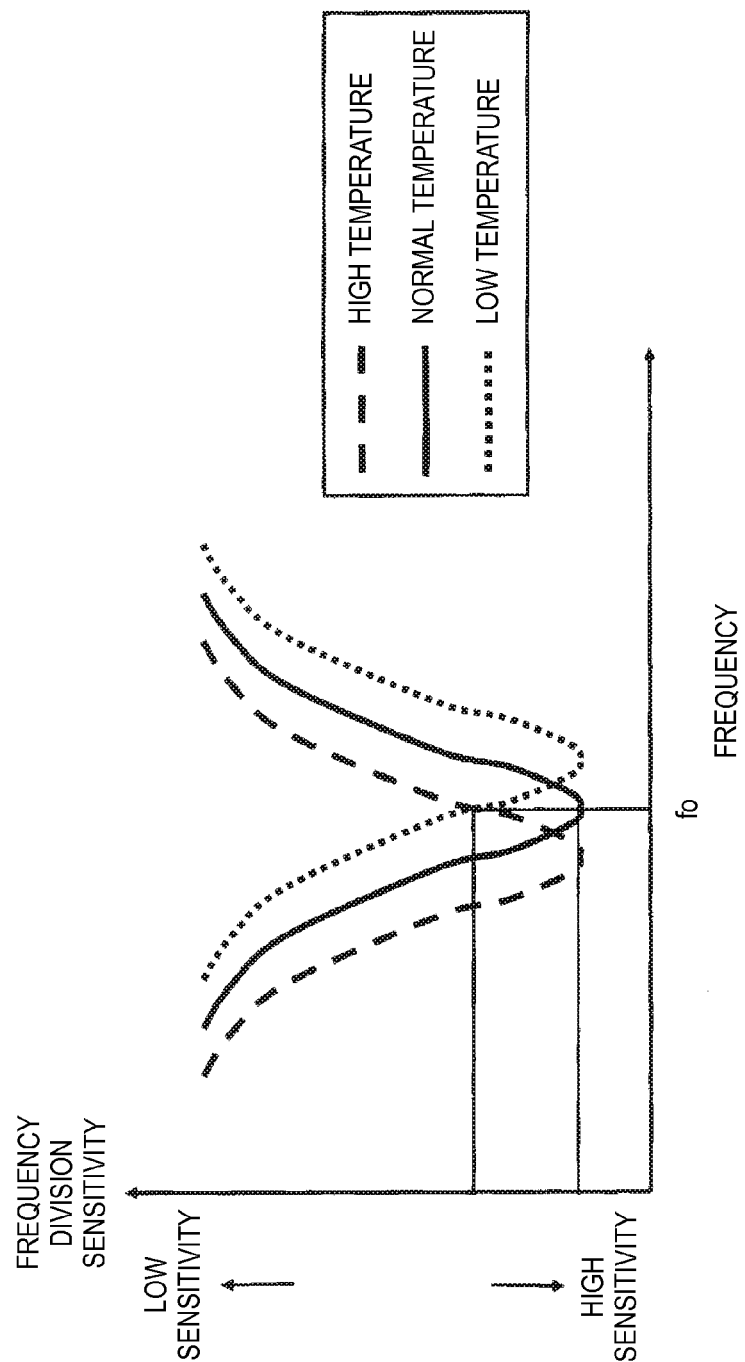
FIG. 29 is a schematic view showing an example of the characteristic of frequency division sensitivity to frequency for each temperature in the related art.

FIG. 29 is a schematic view showing a sensitivity characteristic by a temperature characteristic of a circuit of a frequency divider of the related art and showing an example of the characteristic of frequency division sensitivity to frequency. Comparing when temperature is low, when temperature is Typical, and when temperature is high, it is possible to divide the frequency fo with high sensitivity when temperature is Typcal.

As shown in FIG. 29, when dividing the frequency fo in a state of high temperature or low temperature without taking into consideration manufacturing variation, sensitivity is lowered compared to the state of Typcal, and the frequency may not be divided. When temperature is high, a current flowing in the circuit of the frequency divider 210 is increased, whereby it is possible to divide the frequency with the same frequency division sensitivity as the state of Typical. When temperature is low, the current flowing in the circuit of the frequency divider 210 is decreased, whereby it is possible to divide the frequency with the same frequency division sensitivity as the state of Typical.

Next, the details of the bias voltage 220 (first bias voltage) of the PMOS 211 will be described. For example, the voltage generation circuit 140 applies a current I12 derived by Expression (11) to the resistor 6 shown in FIG. 15 to obtain an output voltage.

$$I12 = I2 - I1 - I3 - 4 \quad \text{Expression (11)}$$

Figure 30:
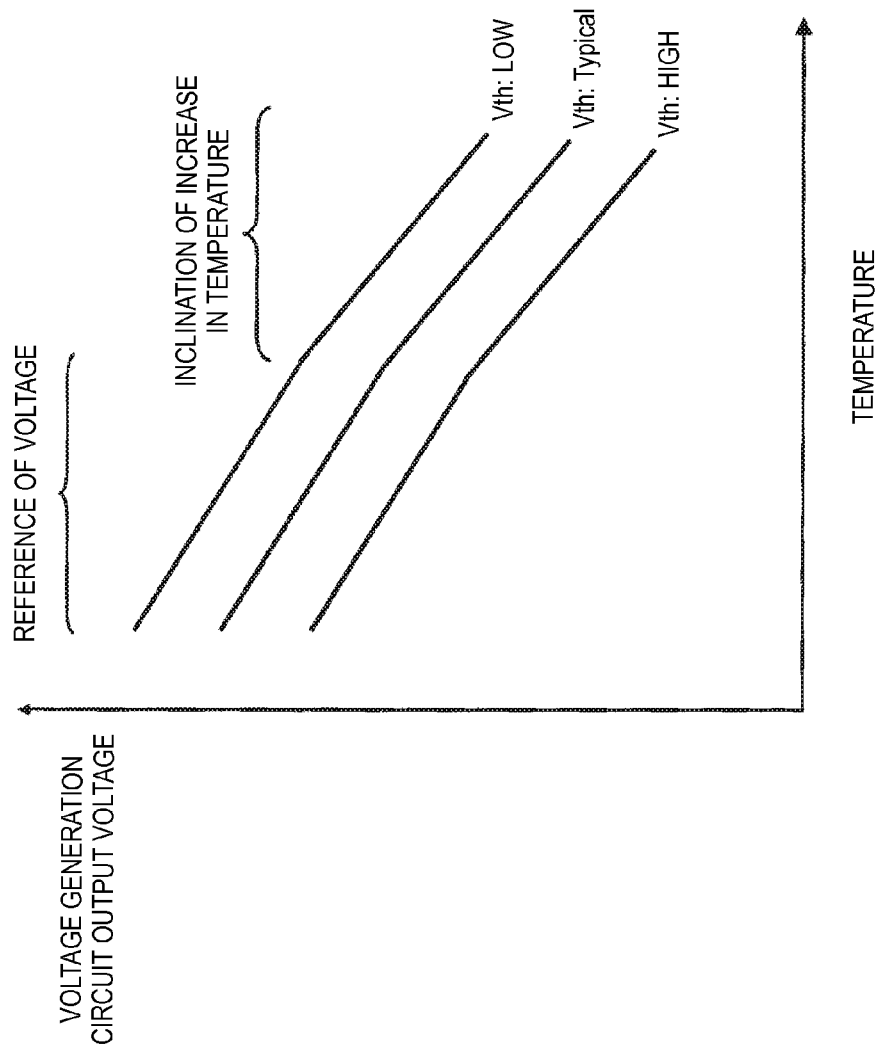
FIG. 30 is a schematic view showing an example of the characteristic of an output voltage (first bias voltage) of a voltage generation circuit to temperature for each threshold voltage of a transistor in the fourth embodiment.

FIG. 30 is a schematic view showing an example of the output voltage of the voltage generation circuit 140, to which the current I12 is supplied. A reference of a voltage is generated by the currents I1 and I2, a voltage of an inclination component of an increase in temperature is generated by the current I3, and a voltage including manufacturing variation is generated by the current I4. With this, it is possible to generate the bias voltage 220 according to the temperature characteristic and manufacturing variation of the PMOS 211.

Next, the details of the bias voltage 230 (second bias voltage) of the NMOS 212 will be described. The voltage generation circuit 140 applies a current I13 derived by Expression (12) to the resistor 6 shown in FIG. 15 to obtain an output voltage.

$$I13 = I1 + I2 + I3 + I4 \quad \text{Expression (12)}$$

Figure 31:
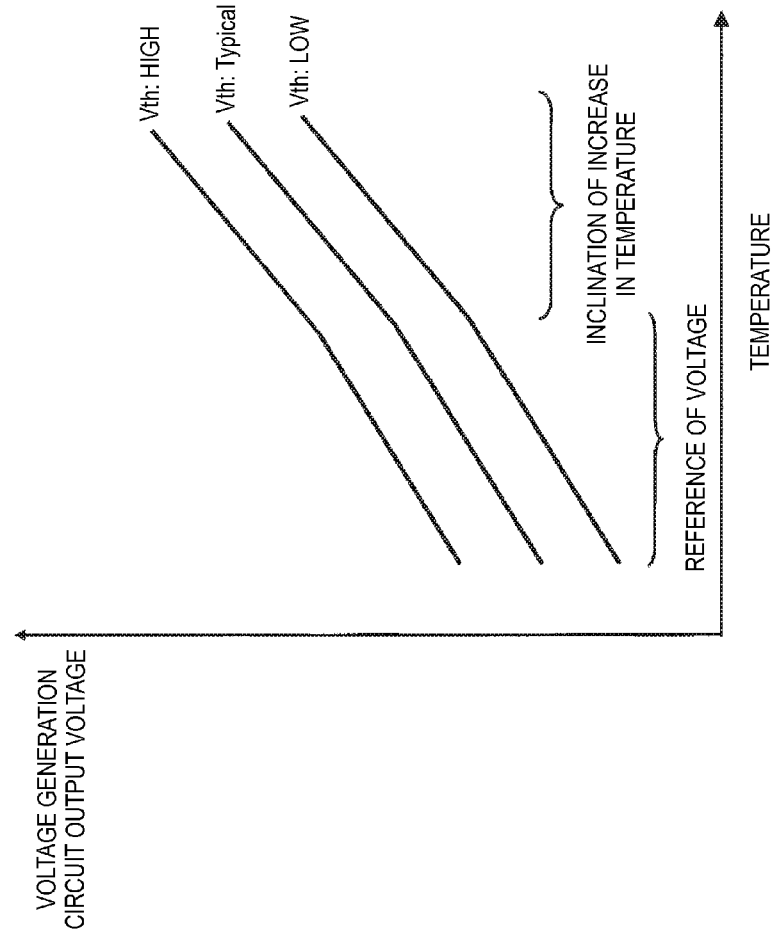
FIG. 31 is a schematic view showing an example of the characteristic of an output voltage (second bias voltage) of the voltage generation circuit to temperature for each threshold voltage of a transistor in the fourth embodiment.

FIG. 31 is a schematic view showing an example of the output voltage of the voltage generation circuit 140, to which the current I13 is supplied. A reference of a voltage is generated by the currents I1 and I2, a voltage of an inclination component of an increase in temperature is generated by the current I13, and a voltage including manufacturing variation is generated by the current I4. With this, it is possible to generate the bias voltage 230 according to the temperature characteristic and manufacturing variation of the NMOS 212.

The voltage generation circuit 140 adjusts the input voltage of each of the PMOS 211 and the NMOS 212 based on at least one of manufacturing variation and the temperature characteristic, that is, based on the output of at least one of the temperature detection circuit 110 and the manufacturing variation detection circuit 120. The voltage has a characteristic inverse to the characteristic to temperature and the characteristic to manufacturing variation of each of the PMOS 211 and the NMOS 212. Accordingly, the frequency divider 210 can maintain frequency division sensitivity constant without depending on the temperature characteristic and manufacturing variation and can divide the frequency in a state of high sensitivity.

The currents I12 and I13 are an example of a current which is input to the voltage generation circuit 140. The currents I12 and I13 may have other current values when the frequency divider 210 does not depend on at least one of the temperature characteristic and the manufacturing variation.

The present disclosure is not limited to the configurations of the above-described embodiments, and any configuration may be applied insofar as the functions described in the appended claims or the functions of the configurations of the embodiments can be attained.

In the above-described embodiments, although the MOS has been illustrated as the transistor, the present disclosure can be applied to other transistors (for example, a bipolar transistor). When a bipolar transistor is used, the level of a current amplification factor hFE (hybrid forward emitter), instead of the threshold voltage Vth, can be detected.

Although the present disclosure has been described in detail or referring to the specific embodiments, it is evident to those skilled in the art that various modifications or corrections may be made without departing from the spirit and scope of the present disclosure.

This application is based on Japanese Patent Application No. 2013-067417, filed on Mar. 27, 2013, the contents of which are incorporated herein by reference.

(Summary of Aspects of Disclosure)

A compensation circuit according to a first aspect of the present disclosure is configured by including:

a manufacturing variation detection circuit which detects a manufacturing variation of a transistor based on a first voltage output from an output terminal of the transistor having an input terminal applied with a substantially constant first current to temperature or based on a second current output from an output terminal of the transistor having an input terminal applied with a substantially constant second voltage to temperature; and a voltage generation circuit which generates a supply voltage supplied to an electric circuit based on the manufacturing variation detected by the manufacturing variation detection circuit, wherein the first current corresponds to the substantially constant second voltage to temperature, and the first voltage corresponds to the substantially constant second current to temperature.

A compensation circuit according to a second aspect of the present disclosure is the compensation circuit of the first aspect, wherein the first current is a current at an intersection point of a plurality of first voltage-current characteristics representing voltages output to respective currents applied to the transistor for each temperature, and the second voltage is a voltage at an intersection point of a plurality of second voltage-current characteristics representing currents output to respective voltages applied to the transistor for each temperature.

A compensation circuit according to a third aspect of the present disclosure is the compensation circuit of the first or second aspect, wherein the manufacturing variation detection circuit outputs the first voltage by applying the first current to the transistor, and outputs the first voltage, and outputs a third current flowing in a resistive element across both ends of which the first voltage is given, and the voltage generation circuit generates the supply voltage based on the third current output from the manufacturing variation detection circuit.

A compensation circuit according to a fourth aspect of the present disclosure is the compensation circuit of the first or second aspect, wherein the transistor is applied with the second voltage to output the second current, and the voltage generation circuit generates the supply voltage based on the second current output from the manufacturing variation detection circuit.

A compensation circuit according to a fifth aspect of the present disclosure is the compensation circuit of the third aspect, wherein the manufacturing variation detection circuit detects whether or not a threshold voltage of the transistor is higher than a predetermined voltage based on the third current and the first current.

A compensation circuit according to a sixth aspect of the present disclosure is the compensation circuit of the fourth aspect, wherein the manufacturing variation detection circuit detects whether or not a threshold voltage of the transistor is lower than a predetermined voltage based on the second current and the first current.

A compensation circuit according to a seventh aspect of the present disclosure is the compensation circuit of any one of the first to sixth aspects, including a temperature-current characteristic generation circuit which generates a temperature-current characteristic based on a fourth current proportional to temperature and the substantially constant first current to temperature, wherein the voltage generation circuit generates the supply voltage based on the temperature-current characteristic generated by the temperature-current characteristic generation circuit.

A compensation circuit according to an eighth aspect of the present disclosure is the compensation circuit of the seventh aspect, wherein the temperature-current characteristic generation circuit generates a fifth current based on s difference between the fourth current and the first current, and the voltage generation circuit generates the supply voltage based on the fifth current generated by the temperature-current characteristic generation circuit.

A compensation circuit according to a ninth aspect of the present disclosure is the compensation circuit of the seventh or eighth aspect, wherein the voltage generation circuit generates a power supply voltage of the electric circuit as the supply voltage based on the manufacturing variation or the temperature-current characteristic.

A compensation method according to the present disclosure is a compensation method in a compensation circuit, the method including the steps of:

detecting a manufacturing variation of a transistor based on a first voltage output from all output terminal of the transistor having an input terminal applied with a substantially constant first current to temperature or based on a second current output from an output terminal of the transistor having an input terminal applied with a substantially constant second voltage to temperature; and generating a supply voltage supplied to an electric circuit based on the detected manufacturing variation, wherein the first current corresponds to the substantially constant second voltage to temperature, and the first voltage corresponds to the substantially constant second current to temperature.

INDUSTRIAL APPLICABILITY

The present disclosure is useful for a compensation circuit, a compensation method, and the like capable of improving compensation precision for manufacturing variations.

REFERENCE SIGNS LIST 1000, 1000B: compensation circuit
100: first amplifier
100B: cascode power amplifier
110: temperature detection circuit
120, 120A, 120B, 120C, 120D: manufacturing variation detection circuit
130: power supply voltage generation circuit
140: voltage generation circuit
150: bias circuit
160: input matching circuit
170: output matching circuit
180: load inductor
190: first transistor
200: second transistor
210: frequency divider
211: PMOS
212: NMOS
213: inverter
220: NMOS bias voltage
230: NMOS bias voltage
T1, T2, T3, T4: transistor
OA2, OA3, OA4: operational amplifier

The invention claimed is:

1. A compensation circuit comprising:
a manufacturing variation detection circuit which detects a manufacturing variation of a transistor based comparing on a first voltage output from an output terminal of the transistor to a feedback voltage, the transistor having an input terminal receiving a first current substantially constant to temperature; and
a voltage generation circuit which generates a supply voltage supplied to an electric circuit based on the manufacturing variation detected by the manufacturing variation detection circuit, wherein
the first current supplied to the terminal of the transistor corresponds to the first voltage that is substantially constant to temperature.

2. The compensation circuit according to claim 1, wherein, the first current is a current at an intersection point of a plurality of first voltage-current characteristics representing voltages output to respective currents applied to the transistor for each temperature.

3. The compensation circuit according to claim 1, wherein the manufacturing variation detection circuit outputs the first voltage by applying the first current to the transistor, and outputs a second current flowing in a resistive element across both ends of which the first voltage is given, and the voltage generation circuit generates the supply voltage based on the second current output from the manufacturing variation detection circuit.

4. The compensation circuit according to claim 3, wherein the manufacturing variation detection circuit detect whether or not a threshold voltage of the transistor is higher than a predetermined voltage based on the second current and the first current.

5. The compensation circuit according to claim 1, further comprising:

a temperature-current characteristic generation circuit which generates a temperature-current characteristic based on a third current proportional to temperature and the first current substantially constant to temperature, wherein the voltage generation circuit generates the supply voltage based on the temperature-current characteristic generated by the temperature-current characteristic generation circuit.

6. The compensation circuit according to claim 5, wherein the temperature-current characteristic generation circuit generates a fourth current based on a difference between the third current and the first current, and the voltage generation circuit generates the supply voltage based on the fourth current generated by the temperature-current characteristic generation circuit.

7. The compensation circuit according to claim 5, wherein the voltage generation circuit generates a power supply voltage of the electric circuit as the supply voltage based on the manufacturing variation or the temperature-current characteristic.

8. The compensation circuit according to claim 1, wherein the manufacturing variation detection circuit includes an amplifier having a first input configured to receive the first voltage and a second input configured to receive the feedback voltage that is an output voltage of the amplifier.

9. A compensation method in a compensation circuit, the method comprising the steps of:

detecting a manufacturing variation of a transistor based on comparing a first voltage output from an output terminal of the transistor to a feedback voltage, the transistor having an input terminal receiving a first current substantially constant to temperature; and generating a supply voltage supplied to an electric circuit based on the detected manufacturing variation, wherein the first current supplied to the input terminal of the transistor corresponds to the first voltage that is substantially constant to temperature.

10. The compensation method according to claim 9, wherein the first current is a current at an intersection point of a plurality of first voltage-current characteristics representing voltages output to respective currents applied to the transistor for each temperature.

11. The compensation method according to claim 9, further comprising:

outputting the first voltage by applying the first current to the transistor;

outputting a second current flowing in a resistive element;

providing the first voltage across both ends of resistive element; and generating the supply voltage based on the second current.

12. The compensation method according to claim 11, further comprising:

detecting whether or not a threshold voltage of the transistor is higher than a predetermined voltage based on the second current and the first current.

13. The compensation method according to claim 9, further comprising:

generating a temperature-current characteristic based on a third current proportional to temperature and the first current; and generating the supply voltage based on the temperature-current characteristic.

14. The compensation method according to claim 13, further comprising:

generating a fourth current based on a difference between the third current and the first current, and generating the supply voltage based on the fourth current.

15. The compensation method according to claim 13, further comprising:

generating a power supply voltage of the electric circuit as the supply voltage based on the manufacturing variation or the temperature-current characteristic.

16. The compensation method according to claim 9, wherein comparing the first voltage to the feedback voltage includes:

providing the first voltage to a first input of an amplifier; and providing the feedback voltage representing an output of the amplifier to a second input of the amplifier.

* * * * *